United States Patent
Heggemann et al.

(10) Patent No.: US 11,201,306 B2
(45) Date of Patent: Dec. 14, 2021

(54) ACTIVE OLED DISPLAY, METHOD FOR PREPARING AN ACTIVE OLED DISPLAY AND COMPOUND

(71) Applicant: Novaled GmbH, Dresden (DE)

(72) Inventors: Ulrich Heggemann, Dresden (DE); Markus Hummert, Dresden (DE)

(73) Assignee: Novaled GmbH, Dresden (DE)

( * ) Notice: Subject to any disclaimer, the term of this patent is extended or adjusted under 35 U.S.C. 154(b) by 0 days.

(21) Appl. No.: 16/485,839

(22) PCT Filed: Feb. 20, 2018

(86) PCT No.: PCT/EP2018/054160
§ 371 (c)(1),
(2) Date: Aug. 14, 2019

(87) PCT Pub. No.: WO2018/150050
PCT Pub. Date: Aug. 23, 2018

(65) Prior Publication Data
US 2020/0006689 A1    Jan. 2, 2020

(30) Foreign Application Priority Data

Feb. 20, 2017 (EP) .................................... 17156902
Feb. 20, 2017 (EP) .................................... 17156904
Feb. 20, 2017 (EP) .................................... 17156906

(51) Int. Cl.
*H01L 51/50* (2006.01)
*C07F 3/02* (2006.01)
(Continued)

(52) U.S. Cl.
CPC .............. *H01L 51/506* (2013.01); *C07F 3/02* (2013.01); *C07F 3/06* (2013.01); *C07F 5/022* (2013.01);
(Continued)

(58) Field of Classification Search
CPC .......................... H01L 51/5056; H01L 51/506
See application file for complete search history.

(56) References Cited

U.S. PATENT DOCUMENTS 5,247,226 A   9/1993 Sato et al.
7,288,331 B2  10/2007 Thompson et al.
(Continued)

FOREIGN PATENT DOCUMENTS

CN   109494262 A   3/2019
EP     0510541 A2   4/1992
(Continued)

OTHER PUBLICATIONS

PCT International Search Report and Written Opinion for PCT Application No. PCT/EP2018/054160 dated May 29, 2018 (14 pages).
(Continued)

*Primary Examiner* — Jae Lee
(74) *Attorney, Agent, or Firm* — Eversheds Sutherland (US) LLP

(57) ABSTRACT

The present invention relates to a display device comprising—a plurality of OLED pixels comprising at least two OLED pixels, the OLED pixels comprising an anode, a cathode, and a stack of organic layers, wherein the stack of organic layers—is arranged between and in contact with the cathode and the anode, and—comprises a first electron transport layer, a first hole transport layer, and a first light emitting layer provided between the first hole transport layer and the first electron transport layer, and—a driving circuit configured to separately driving the pixels of the plurality of OLED pixels, wherein, for the plurality of OLED pixels, the first hole transport layer is provided in the stack of organic layers as a common hole transport layer shared by the plurality of OLED pixels, and the first hole transport layer comprises (i) at least one first hole transport matrix com-
(Continued)

pound consisting of covalently bound atoms and (ii) at least one electrical p-dopant selected from metal salts and from electrically neutral metal complexes comprising a metal cation and at least one anion and/or at least one anionic ligand consisting of at least 4 covalently bound atoms, wherein the metal cation of the electrical p-dopant is selected from alkali metals; alkaline earth metals, Pb, Mn, Fe, Co, Ni, Zn, Cd; rare earth metals in oxidation state (II) or (III); Al, Ga, In; and from Sn, Ti, Zr, Hf, V, Nb, Ta, Cr, Mo and W in oxidation state (IV) or less, a method for preparing the display device and a chemical compound for use therein.

17 Claims, 4 Drawing Sheets

(51) Int. Cl.

| | | |
|---|---|---|
| *C07F 3/06* | (2006.01) | |
| *H01L 27/32* | (2006.01) | |
| *H01L 51/00* | (2006.01) | |
| *H01L 51/56* | (2006.01) | |
| *C07F 5/02* | (2006.01) | |
| *C09K 11/06* | (2006.01) | |
| *H01L 51/42* | (2006.01) | |

(52) U.S. Cl.
CPC .......... *C09K 11/06* (2013.01); *H01L 27/3211* (2013.01); *H01L 51/002* (2013.01); *H01L 51/005* (2013.01); *H01L 51/006* (2013.01); *H01L 51/008* (2013.01); *H01L 51/0054* (2013.01); *H01L 51/0061* (2013.01); *H01L 51/0071* (2013.01); *H01L 51/0072* (2013.01); *H01L 51/0077* (2013.01); *H01L 51/0084* (2013.01); *H01L 51/0092* (2013.01); *H01L 51/5092* (2013.01); *H01L 51/56* (2013.01); *C09K 2211/1018* (2013.01); *H01L 51/001* (2013.01); *H01L 51/0052* (2013.01); *H01L 51/4253* (2013.01); *H01L 51/5012* (2013.01); *H01L 51/5072* (2013.01); *H01L 51/5076* (2013.01); *H01L 51/5088* (2013.01); *H01L 51/5096* (2013.01); *H01L 2251/308* (2013.01)

(56) References Cited

U.S. PATENT DOCUMENTS

| | | | |
|---|---|---|---|
| 8,674,047 B2 | 3/2014 | Brown et al. | |
| 8,835,022 B2 | 9/2014 | Hamada et al. | |
| 9,006,716 B2 | 4/2015 | Hartmann et al. | |
| 9,496,509 B2 | 11/2016 | Funyuu et al. | |
| 9,515,277 B2 | 12/2016 | Okabe et al. | |
| 9,583,714 B2 | 2/2017 | Funyuu et al. | |
| 10,297,767 B2 | 5/2019 | Dorok et al. | |
| 10,411,197 B2 * | 9/2019 | Maltenberger | C07F 9/94 |
| 10,658,599 B2 | 5/2020 | Frey et al. | |
| 2006/0279204 A1 | 12/2006 | Forrest et al. | |
| 2009/0054232 A1 | 2/2009 | Dick et al. | |
| 2012/0037907 A1 * | 2/2012 | Whiting | H01L 51/0021 257/57 |
| 2013/0330632 A1 | 12/2013 | Burschka et al. | |
| 2014/0264295 A1 | 9/2014 | Sim et al. | |
| 2015/0108456 A1 * | 4/2015 | Shin | H01L 51/5044 257/40 |
| 2015/0162534 A1 | 6/2015 | Maltenberger et al. | |
| 2015/0235119 A1 * | 8/2015 | Colman | G06K 7/1404 235/454 |
| 2016/0284883 A1 | 9/2016 | Feng et al. | |
| 2018/0066186 A1 * | 3/2018 | Zych | C09K 11/0883 |
| 2019/0040188 A1 * | 2/2019 | Nanson | H01L 51/0068 |
| 2019/0330485 A1 | 10/2019 | Endo et al. | |
| 2020/0020860 A1 | 1/2020 | Nakaie et al. | |
| 2020/0321657 A1 | 10/2020 | Burkhardt et al. | |
| 2021/0202842 A1 | 7/2021 | Fadhel et al. | |

FOREIGN PATENT DOCUMENTS

| | | |
|---|---|---|
| EP | 1209708 A1 | 5/2002 |
| EP | 2693506 A1 | 5/2014 |
| EP | 3002797 A1 | 4/2016 |
| EP | 3133663 A1 | 2/2017 |
| EP | 3133664 A1 | 2/2017 |
| JP | 2001-131385 A | 5/2001 |
| JP | 2002203683 A | 7/2002 |
| JP | 4320484 B2 | 8/2009 |
| JP | 2011-228723 A | 11/2011 |
| WO | 2013/052096 A1 | 4/2013 |
| WO | 2017/014946 A1 | 1/2017 |

OTHER PUBLICATIONS

Pitula et al., "Synthesis, Structure, and Physico-Optical Properties at Manganate(II)-Based Ionic Liquids," Chem. Eur. J., 2010, 16:3355-3365.
PCT International Search Report and Written Opinion for PCT Application No. PCT/EP2018/054162 dated May 29, 2018 (9 pages).
Menke et al., "Highly Efficient p-Dopants in Amorphous Hosts," Organic Electronics, 2014, 15:365-371.
Xia et al., "Influence of Doped Anions on Poly(3,4-ethylenedioxythiophene) as Hole Conductors for Iodine-Free Solid-State Dye-Sensitized Solar Cells," J Am. Chem. Soc., 2008, 130(4):1258-1263.
PCT International Search Report and Written Opinion for PCT Application No. PCT/EP2018/053954 dated May 23, 2018 (9 pages).
Romero et al., "Highly Fluorinated Hydrotris(indazolyl)borate Calcium Complexes: The Structure and Reactivity Heavily Depend on the Ligand's Electronic Properties," Dalton Trans., 2014, 43:10114-10119.
PCT International Search Report and Written Opinion for PCT Application No. PCT/EP2018/054157 dated May 29, 2018 (11 pages).
Dong et al., "Highly Efficient Simplified Organic Light-Emitting Diodes Utilizing F4-TCNQ as an Anode Buffer Layer," Chin. Phys. Lett., 2010, 27(12):127802-1-127802-4.
PCT International Search Report and Written Opinion for PCT Application No. PCT/EP2018/054154 dated May 29, 2018 (12 pages).
Taiwan Office Action for TW Application No. 107105850 dated Sep. 16, 2021 (8 pages)(English translation).
Japanese Office Action for JP Application No. 2019545368 dated Sep. 28, 2021 (8 pages)(English translation).
European Office Action for EP Application No. 18706500.8 dated Jul. 22, 2021 (6 pages).
Japanese Office Action for JP Application No. 2019-544860 dated Jul. 6, 2021 (3 pages).
Taiwan Office Action for TW Application No. 1102068610 dated Jul. 20, 2021 (8 pages).
Taiwan Search Report for TW Application No. 107105849 dated Jul. 20, 2021 (1 page).
Japanese Office Action for JP Application No. 2019-544850 dated Jul. 27, 2021 (5 pages).
Chinese Office Action for CN Application No. 201880012814.3 dated Aug. 17, 2021 (21 pages, English translation).
Chinese Office Action for CN Application No. 201880012559.2 dated Aug. 25, 2021 (17 pages, English translation).
Taiwan Office Action for TW Application No. 107105623 dated Sep. 1, 2021 (5 pages).
Japanese Office Action for JP Application No. 2019-544861 dated Sep. 14, 2021 (6 pages).

(56) References Cited

OTHER PUBLICATIONS

Taiwan Office Action for TW Application No. 107105848 dated Sep. 3, 2021 (7 pages).

* cited by examiner

ACTIVE OLED DISPLAY, METHOD FOR PREPARING AN ACTIVE OLED DISPLAY AND COMPOUND

CROSS REFERENCE TO RELATED APPLICATIONS

This application is a U.S. national stage application of PCT/EP2018/054160, filed Feb. 20, 2018, which claims priority to European Patent Application Nos. 17156902.3, 17156904.9, and 17156906.4, which were filed Feb. 20, 2017. The content of these applications is incorporated herein by reference.

The disclosure relates to an active (NED display having a plurality of OLED pixels and comprising a non-oxidizing p-dopant in a hole injection and/or hole transport layer shared by at least two pixels, a method of preparing the active OLED display and to a compound particularly suitable for the display.

BACKGROUND

With respect to active OLED displays, comprising a plurality of OLED pixels sharing a common hole transport layer, challenging requirements are put on semiconducting materials used in layers arranged between the anode and the emitting layer and shared by the plurality of pixels. On one hand, the materials shall enable individual driving of individual pixels at operational voltages which are as low as possible. On the other hand, so called electrical crosstalk between neighbour pixels should be avoided. The application WO2016/050834 which is herein incorporated by the reference teaches that these contradictory requirements can be fulfilled by p-doped layers having electrical conductivity in the range $1\times10^{-3}$ S·m$^{-1}$ and $1\times10^{-8}$ S·m$^{-1}$, most favourably between $1\times10^{-5}$ S·m$^{-1}$ and $1\times10^{-6}$ S·m$^{-1}$. Such low-conductivity p-doped hole transport layers are achievable by use of usual state-of-art redox dopants, like strongly electron accepting radialene compounds, in matrices which are poorly dopable in terms of their deep HOMO level. There is, however, continuing demand for p-dopants fulfilling these criteria and improved in other parameters, e.g. from the viewpoint of processability and device stability.

SUMMARY

It is an object to provide improved active OLED displays and improved materials enabling this improvement. In one aspect, electrical crosstalk between neighbor pixels of the active OLED display shall be reduced. In another aspect, the improved materials should enable robust display manufacturing, e.g. in terms of improved device stability during any processing step which comprises a treatment of the device or its particular layer at an elevated temperature.

The object is achieved through a display device comprising
  a plurality of OLED pixels comprising at least two OLED pixels, the OLED pixels comprising an anode, a cathode, and a stack of organic layers, wherein the stack of organic layers
    is arranged between and in contact with the cathode and the anode, and
    comprises a first electron transport layer, a first hole transport layer, and a first light emitting layer provided between the first hole transport layer and the first electron transport layer, and
  a driving circuit configured to separately driving the pixels of the plurality of OLED pixels,
  wherein, for the plurality of OLED pixels, the first hole transport layer is provided in the stack of organic layers as a common hole transport layer shared by the plurality of OLED pixels, and the first hole transport layer comprises
    (i) at least one first hole transport matrix compound consisting of covalently bound atoms and
    (ii) at least one electrical p-dopant selected from metal salts and from electrically neutral metal complexes comprising a metal cation and at least one anion and/or at least one anionic ligand consisting of at least 4 covalently bound atoms,
  wherein the metal cation of the electrical p-dopant is selected from alkali metals;
  alkaline earth metals, Pb, Mn, Fe, Co, Ni, Zn, Cd; rare earth metals in oxidation state (II) or (III); Al, Ga, In; and from Sn, Ti, Zr, Hf, V, Nb, Ta, Cr, Mo and W in oxidation state (IV) or less.

In one embodiment, the anion and/or the anionic ligand is bound to the metal cation of the p-dopant through an oxygen atom, preferably through two oxygen atoms.

It is to be understood that the term "bound" encompasses structures of the p-dopant, wherein the distance between the metal cation and the oxygen atom/atoms is shorter that the distance between the metal cation and any other atom of the anion and/or of the anionic ligand.

For example, solid-state structure studies of some bis (sulfonyl)imide complexes of divalent and/or trivalent metals revealed that the bis(sulfonyl)imide ligand may be attached to the central metal atom rather by oxygen atoms of the sulfonyl groups than by the imide nitrogen atom which may be in fact arranged more distant from the central metal atom than the oxygen atoms.

In an embodiment, the oxygen atom of the anion and/or of the anionic ligand which is in the metal salt and/or in the metal complex bound to the metal cation has in dichloroethane lower basicity than at least one non-oxygen atoms of the anion and/or of the anionic ligand.

Analogously, in another embodiment, each of the oxygen atoms of the anion and/or of the anionic ligand which are in the metal salt and/or in the metal complex bound to the metal cation has in dichloroethane lower basicity than at least one non-oxygen atom of the anion and/or of the anionic ligand. It is to be understood that the basicity of an atom in the anion and/or in the anionic ligand in an environment, e.g. in 1,2-dichloroethane, is inversely proportional to the acidity of a corresponding tautomeric form of the electrically neutral conjugated acid formed by addition of one or more protons in the same environment. Measurement of the acidity in 1,2-dichloroethane as a versatile tool for comparison of various acids is described in Journal of Organic Chemistry (2011), 76(2), 391-395. It is understood that if the basicity of a particular atom in an anion and/or anionic ligand has to be assessed, the "corresponding tautomeric form" of the electrically neutral conjugated acid is the acid formed by proton addition to the particular atom.

In one embodiment, the anion and/or the anionic ligand consists of at least 5, preferably at least 6, more preferably at least 7, even more preferably at least 8, most preferably at least 9 covalently bound atoms.

In one embodiment, the anion and/or the anionic ligand comprises at least one atom selected from B, C, N.

In one embodiment, the anion and/or the anionic ligand comprises at least two atoms selected from B, C and N which are bound to each other by a covalent bond.

In one embodiment, the anion and/or the anionic ligand comprises at least one peripheral atom selected from H, N, O, F, Cl, Br and I. Under "peripheral atom", it is to be understood an atom which is covalently bound to only one atom of the anion and/or of the anionic ligand. Oppositely, atoms covalently bound to at least two other atoms of the anion and/or of the anionic ligand are assigned as inner atoms.

Under covalent bond, it is to be understood any bonding interaction which involves electron density sharing between the two assessed atoms, wherein the bonding is stronger than van der Waals dispersive interactions; for the sake of simplicity, binding energy 10 kJ/mol may be taken as an arbitrary lower limit. In this sense, the term includes also coordination bonds or hydrogen bonds. Anions and/or anionic ligands comprising hydrogen bonds, however, are not particularly preferred.

In one embodiment, the anion and/or the anionic ligand comprises at least one electron withdrawing group selected from halogenated alkyl, halogenated (hetero)aryl, halogenated (hetero)arylalkyl, halogenated alkylsulfonyl, halogenated (hetero)arylsulfonyl, halogenated (hetero)arylalkylsulfonyl, cyano. It is to be understood that for the sake of brevity, halogenated (hetero)aryl means "halogenated aryl or halogenated heteroaryl", halogenated (hetero)arylalkyl means "halogenated heteroarylalkyl or halogenated arylalkyl", halogenated (hetero)arylsulfonyl means "halogenated heteroarylsulfonyl or halogenated arylsulfonyl" and halogenated (hetero)arylalkylsulfonyl means "halogenated heteroarylalkylsulfonyl or halogenated arylalkylsulfonyl".

In one embodiment, the electron withdrawing group is a perhalogenated group. It is to be understood that the term "halogenated" means that at least one hydrogen atom of a group comprising peripheral or inner hydrogen atoms is replaced with an atom selected from F, Cl, Br and I. It is further understood that in a perhalogenated group, all hydrogen atoms comprised in the unsubstituted group are replaced with atoms independently selected from F, Cl, Br and I. Accordingly, under perfluorinated group, it is to be understood a perhalogenated group, wherein all halogen atoms replacing hydrogen atoms are fluorine atoms.

In one embodiment, the metal cation of the p-dopant is selected from Li(I), Na(I), K(I), Rb(I), Cs(I); Mg(II), Ca(II), Sr(II), Ba(II), Sn(II), Pb(II), Mn(II), Fe(II), Co(II), Ni(II), Zn(II), Cd(II), Al(III); rare earth metal in oxidation state (III), V(III), Nb(III), Ta(III), Cr(III), Mo(III), W(III) Ga(III), In(III) and from Ti(IV), Zr(IV), Hf(IV), Sn(IV).

In one embodiment, in the p-dopant molecule, the atom of the anion and/or of the anionic ligand which is closest to the metal cation is a C or a N atom.

In one embodiment, the acidity of the electrically neutral conjugated acid formed from the anion and/or anionic ligand by addition of one or more protons in 1,2-dichloroethane is higher than that of HCl, preferably higher than that of HBr, more preferably higher than that of HI, even more preferably higher than that of fluorosulfuric acid, and most preferably higher than that of perchloric acid.

In one embodiment, the electrical p-dopant has energy level of its lowest unoccupied molecular orbital computed by standard quantum chemical method and expressed in absolute vacuum scale at least 0.5 eV, preferably at least 0.6 eV, more preferably at least 0.8 eV, even more preferably at least 1.0 eV, most preferably at least 1.2 eV above the energy level of the highest occupied orbital of the covalent hole transport compound computed by the standard quantum chemical method.

The standard quantum chemical method may be the software package TURBOMOLE using DFT functional B3LYP with the basis set def2-TZVP.

In one embodiment, the first hole transport matrix compound is an organic compound, preferably an organic compound comprising a conjugated system of at least 6, more preferably at least 10 delocalized electrons; also preferably, the first hole transport matrix compound comprises at least one triaryl amine structural moiety, more preferably, the first hole transport matrix compound comprises at least two triaryl amine structural moieties.

The object is further achieved by method for preparing the display device according to any of the preceding embodiments, the method comprising at least one step wherein the hole transport matrix compound and the electrical p-dopant are in mutual contact exposed to a temperature above 50° C.

It is to be understood that "in mutual contact" does mean the presence of both components in a condensed phase, or their presence in two condensed phases which share a common phase interface.

The method may further comprise at least one step wherein the p-dopant is evaporated at a reduced pressure, preferably at a pressure below 1×10$^{-2}$ Pa and at a temperature above 50° C., more preferably at a pressure below 5×10$^{-2}$ Pa and at a temperature above 80° C., even more preferably at a pressure below 1×10$^{-3}$ Pa and at a temperature above 120° C., most preferably at a pressure below 5×10$^{-4}$ Pa and at a temperature above 150° C.

In one embodiment, the method may comprise the steps, wherein
 (i) the p-dopant and the first hole transport matrix compound are dispersed in a solvent,
 (ii) the dispersion is deposited on a solid support and
 (iii) the solvent is evaporated at an elevated temperature.

In one embodiment, the p-dopant may be used in form of a solid hydrate.

In another embodiment, the p-dopant may be used as an anhydrous solid comprising less than 0.10 wt % water, preferably less than 0.05 wt % water.

The object is further achieved by compound having formula (I)

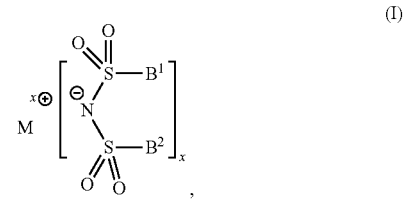

(I)

wherein
M$^{x\oplus}$ is a x-valent cation of a metal selected from alkali metals, alkaline earth metals, rare earth metals and Al, Ga, In, Sn, Pb, Ti, Zr, Hf, V, Nb, Ta, Cr, Mo, W, Mn, Fe, Co, Ni, Zn and Cd;
x is 1 for M selected from alkali metals; 2 for M selected from alkaline earth metals, Pb, Mn, Fe, Co, Ni, Zn and Cd; 2 or 3 for M selected from rare ea metals; 3 for Al, Ga, In; 2, 3 or 4 for Ti, Zr, Hf, V, Nb, Ta, Cr, Mo, W; and 2 or 4 for Sn;
B$^1$ and B$^2$ is independently selected from perhalogenated C$_3$ to C$_{20}$ alkyl, C$_3$ to C$_{20}$ cycloalkyl or C$_3$ to C$_{20}$ arylalkyl;
with the proviso that the compound having formula (I), wherein
a) M is selected from alkali metals, Mg, Ca and Zn and B$^1$ and B$^2$ are independently selected from perfluorinated straight-chain primary alkyl, or
b) M is Li and B$^1$ and B$^2$ is perfluorinated isopropyl, is excluded.

In one embodiment, M is selected from Mg(II), Mn(II) and Zn(II).

In one embodiment, the compound according to formula (I) is provided in a solid form, preferably in a solid form comprising less than 0.10 wt % water, more preferably in a solid form comprising less than 0.05 wt % water, most preferably in a solid crystalline form comprising less than 0.05 wt % water.

In another embodiment, the compound according to formula (I) is provided in form of a solid crystalline hydrate, preferably in form of a solid crystalline hydrate which has water content in the range (i) from 30.33 to 36.33 mol %, preferably from 31.00 to 35.66 mol %, more preferably from 31.00 to 35.66 mol %, even more preferably from 31.66 to 35.00 mol %, even more preferably from 32.33 to 34.33 mol %, most preferably from 33.00 to 33.66 mol %; or (ii) from 18.20 to 21.80 mol %, preferably from 18.60 to 21.40 mol %, more preferably from 19.00 to 21.00 mol %, even more preferably from 19.40 to 20.60 mol %, most preferably from 19.80 to 20.20 mol %.

EFFECT OF THE INVENTION

An important property of materials comprised in organic semi-conducting devices is their conductivity. In a display device having a structured anode and at least two pixels sharing at least one hole transport and/or hole injection layer, as described in WO2016/050834, a limited conductivity of the shared layer may be favourable for achieving a low level of the undesired electrical crosstalk in the display. On the other hand, very low conductivity of the shared layer may increase the operational voltage of the display. WO2016/050834 teaches a conductivity range which represents a trade-off between these contradictory requirements.

The authors of the present application, however, surprisingly found that electrical p-dopants based on certain metal salts and metal complexes enable, under certain conditions, preparing p-doped materials and/or p-doped layers providing stable hole injection from state-of-art anodes into state-of-art hole transport matrices, without substantially increasing the concentration of the free charge carriers above the level which corresponds to conductivities observed in a neat matrix.

This surprising finding offered an opportunity to build the displays of WO2016/050834, operating at fully comparable voltages, even though the hole transport and/or hole injection layers shared by the multiplicity of pixels have conductivities below the optimum range between $1 \times 10^{-5}$ S·m$^{-1}$ and $1 \times 10^{-6}$ S·m$^{-1}$ as disclosed in WO2016/050834 at the level sent application enable efficient operation of display devices of WO2016/050834 at the level of electrical conductivity in p-doped layers shared by the multiplicity of pixels which is near to the detection limit of the available measuring procedure or below it. Thus, the dopants of the present application enable further suppressing the electrical crosstalk in OLED displays and offer new opportunities for designing efficient OLED displays exhibiting very low level of electrical crosstalk. These observations made by the authors will be further described in more detail.

In a previous application EP15181385 filed by the applicant, now published as EP 3 133 663, herein incorporated by the reference, some of the authors described successful use of some metal imides like

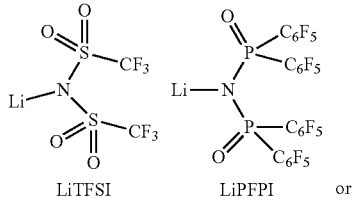

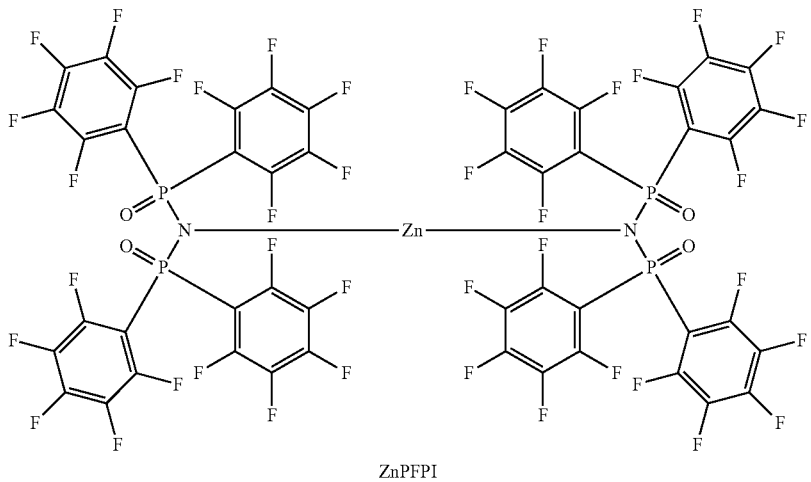

ZnPFPI as hole injection materials in organic electronic devices.

Parallel with further investigation of analogous metal imide compounds, the authors surprisingly found that also some structurally quite different compounds, namely metal borate complexes like

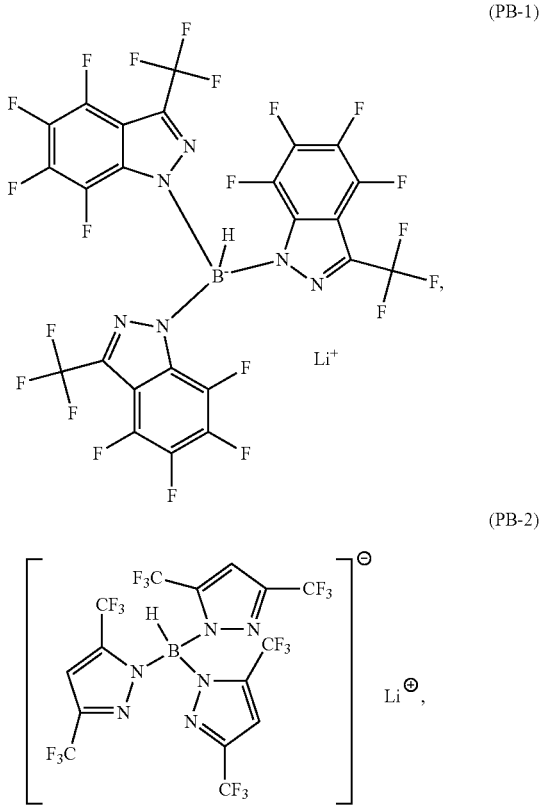

are utilizable in an analogous way.

Some of the authors disclosed in a further application, namely in EP17209023, a compound E3 prepared by sublimation of a zinc sulfonamide complex, having composition $C_{42}F_{48}N_6O_{13}S_6Zn_4$ and crystallizing in a monoclinic crystal lattice belonging to the space group P 1 21 1 with unit cell dimensions a=14.1358 (5) Å, α=90°; b=16.0291 (6) Å, β=113.2920 (10); c=15.9888 (6) Å; γ=90° and unit cell volume 3327.6 (2) Å$^3$. This compound has a structure shown in FIG. 5, comprising a central oxygen dianion surrounded with a first coordination sphere which consists of four tetrahedrally arranged zinc dications, and a second coordination sphere consisting of six sulfonylamide ligands bridging with triatomic —N—S—O— bridges all six edges of the Zn$_4$ cluster.

Most surprisingly, the authors found that all these structurally different compounds analogously exhibit two different modes in their p-doping activity, depending on the process conditions during preparation of the doped material and/or layer.

In the first mode, semiconducting materials and/or layers doped with these compounds (which can be generalized as metal salts and/or electrically neutral metal complexes with an anionic ligand) exhibit well-measurable electrical conductivities which are only slightly lower in comparison with materials and/or layers doped with typical redox p-dopants. It appears that this mode occurs if the doped material and/or layer is exposed to oxygen, even though only in trace amounts.

In the second mode, the semiconducting materials and/or layers doped with the disclosed metal salts and/or electrically neutral metal complexes comprising an anionic ligand exhibit hardly measurable electrical conductivities. This mode occurs if the oxygen access to the doped material and/or layer is strictly avoided throughout processing thereof. The authors found that despite the extremely low conductivity of materials and/or layers doped in the second mode, devices comprising such materials and/or layers particularly as hole transporting or hole injecting layers still exhibit electrical behavior corresponding to an excellent hole injection.

The existence of the two above described modes of p-doping activity provides the disclosed p-dopants with a unique versatility in their use in organic electronic devices, and particularly in displays comprising an anode structured into a multiplicity of pixels sharing a common hole transport layer. The conductivity of the common p-doped layer can be either set in the limits taught in WO2016/050834 by exploiting the first doping mode, or set below these limits, exploiting the second doping mode.

Furthermore, recent investigations made by the authors provided hints that the materials and/or layers doped with the presented metal salts and/or metal complexes may exhibit favourable thermal stability, particularly in materials provided according to the above described second mode of the p-doping action. These properties may be again particularly suitable for the use of the disclosed p-dopants in AMOLED displays, because the necessity of structuring such displays into separate pixels often requires a thermal treatment of p-doped layers or using another treatment which may result in an unavoidable heating of a previously deposited p-doped layer.

In a specific embodiment of the invention, the authors provided new amide compounds comprising builder fluorinated side chains in comparison with the compounds tested in EP15181385. This change resulted in favourable storage properties of the new compounds, which are substantially non-hygroscopic and remain solid even at high air humidity, whereas LiTFSI and analogous TFSI salts have tendency to deliquesce.

DETAILED DESCRIPTION

The electrical conductivity of a thin layer sample can be measured by, for example, the so called two-point method. At this, a voltage is applied to the thin layer and the current flowing through the layer is measured. The resistance, respectively the electrical conductivity, results by considering the geometry of the contacts and the thickness of the layer of the sample. The experimental setup for conductivity measurement used by the authors of the present application enables deposition of p-doped layers as well as conductivity measurement under controlled conditions, especially with regard to contact of deposited layers with an atmosphere comprising oxygen. In this regard, the whole deposition-measurement sequence may be carried out either in a glove-box or in a chamber comprising a controlled atmosphere, using solution processing techniques, or completely in a vacuum chamber, using vacuum thermal evaporation (VTE) as the method of choice, especially suitable for materials and/or layers doped in the second mode.

The electrical conductivity of the first hole transport layer may be lower than $1\times10^{-6}$ S·m$^{-1}$, preferably lower than $1\times10^{-7}$ S·m$^{-1}$, more preferably lower than $1\times10^{-8}$ S·m$^{-1}$. Alternatively, provided that the detection limit of the used conductivity measurement method is lower than $1\times10^{-6}$ S·m$^{-1}$, it is preferred that the conductivity of the first hole transport layer is lower than the detection limit.

The first hole transport layer (HTL) may be formed for the plurality of OLED pixels in the OLED display. In one embodiment, the first HTL may extend over all pixels of the plurality of pixels in the OLED display. Similarly, the cathode may be formed as a common cathode for the plurality of pixels. The common cathode may extend over all pixels of the plurality of pixels in the OLED display. Every individual pixel may have its own anode that may not touch anodes of other individual pixels.

Optionally, for one or more of the plurality of OLED pixels, following organic layers may be provided: a hole blocking layer, an electron injection layer, and/or an electron blocking layer.

Further, the active OLED display has driving circuit configured to separately drive the individual pixels of the plurality of pixels provided in the OLED display. In one embodiment, a step of separately driving may comprise separate control of the driving current applied the individual pixels.

The first HTL is made of a hole transport matrix (HTM) material electrically doped with the p-dopant. The hole transport matrix material may be electrically doped with more than one p-dopant. It is to be understood that the HTM material may consist of one or more HTM compounds, whereas the term hole transport material is a broader term used throughout this application for all semiconducting materials comprising at least one hole transport matrix compound. The hole transport matrix material is not particularly limited. Generally, it is any material consisting of covalently bound atoms which allows embedding the p-dopant. In this sense, infinite inorganic crystals having predominantly covalent bonds like silicon or germanium, or extremely crosslinked inorganic glasses like silicate glass, do not fall in the scope of the definition of the hole transport matrix material. Preferably, the hole transport matrix material may consist of one or more organic compounds.

The first hole transport layer may have a thickness of less than 50 nm, less than 40 nm, less than 30 nm, less than 20 nm, or less than 15 nm.

The first hole transport layer may have a thickness of more than 3 nm, more than 5 nm, more than 8 nm, or more than 10 nm.

In one embodiment of the first hole transport layer, the p-dopant may be distributed homogeneously and isotropically. In another embodiment, the p-dopant may be homogeneously mixed with the matrix but the concentration of the p-dopant may exhibit a gradient across the layer. In one embodiment, the first hole transport layer may comprise a sub-layer, wherein the amount of the p-dopant may, by weight and/or by volume, exceed the total amount of other components which may additionally be comprised in the layer.

In one embodiment, the weight concentration of the p-dopant, based on the overall weight of the sub-layer, may exceed 50%; alternatively, the p-dopant may form at least 75 wt %, alternatively at least 90 wt %, alternatively at least 95 wt %, alternatively at least 98 wt %, alternatively at least 99 wt %, alternatively at least 99.5 wt %, alternatively at least 99.9 wt %, with respect to the total weight of the layer. For the sake of simplicity, any sub-layer of the first transport layer prepared by depositing only the p-dopant may be assigned as a neat (hole injection) p-dopant sub-layer.

The same may apply for any other layer in the display device which may comprise an analognus combination of a hole transport matrix in contact with a metal salt or a metal complex as the first hole transport layer.

For example, pixels comprised in the display device may comprise a hole generation layer, which may, in one embodiment, consist of a hole transport matrix homogeneously doped with the p-dopant. In another embodiment, the hole generation layer may comprise a sub-layer, wherein the amount of the p-dopant exceeds, by weight and/or by volume, the total amount of other components.

The anode may be made of a transparent conductive oxide (TCO), like indium tin oxide (ITO) or aluminium zinc oxide (AZO). Alternatively, the anode may be made of one or more thin metallic layers leading to a semitransparent anode. In another embodiment, the anode may be made of a thick metallic layer which is not transparent to visible light.

The OLED pixel(s) may comprise an electron blocking layer (EBL) provided between the first hole transport layer and the light emitting layer. The EBL may be in direct contact with the first HTL and the EML. The electron blocking layer may be an electrically undoped layer (in other words, it may be free of an electrical dopant) made of an organic hole transport matrix material. The composition of the organic hole transport matrix material of the first hole transport layer may be the same as the composition of the organic hole transport matrix material of the electron blocking layer. In another embodiment of the invention, the composition of both hole transport matrix materials may be different.

The EBL may have a layer thickness of more than 30 nm, more than 50 nm, more than 70 nm, more than 100 nm, or more than 110 nm.

The thickness of the EBL may be less than 200 nm, less than 170 nm, less than 140 nm, or less than 130 nm. Compared to the EBL, the common HTL may be thinner by about one order of magnitude.

Each compound forming the electron blocking layer may have a highest occupied molecular orbital (HOMO) energy level, expressed in the absolute scale referring to vacuum energy level being zero, higher than a HOMO level of any compound forming the hole transport matrix material of the common hole transport layer.

The organic matrix material of the electron blocking layer may have a hole mobility which is equal to or higher than the hole mobility of the matrix material of the hole transport layer.

The hole transport matrix (HTM) material of the common HTL and/or of the EBL may be selected from compounds comprising a conjugated system of delocalized electrons, the conjugated system comprising lone electron pairs of at least two tertiary amine nitrogen atoms.

Suitable compounds for the hole transport matrix material of the doped hole transport layer and/or the common hole transport layer may be selected from the known hole transport matrices (HTMs), e.g. from triaryl amine compounds. HTMs for the doped hole transport material may be compounds comprising a conjugated system of delocalized electrons, wherein the conjugated system comprises lone electron pairs of at least two tertiary amine nitrogen atoms. Examples are N4,N4'-di(naphthalen-1-yl)-N4,N4'-diphenyl-[1,1'-biphenyl]-4,4'-diamine (M), and N4,N4, N4",N4"-tetra ([1,1'-biphenyl]-4-yl)-[1,1':4,1"-terphenyl]-4,4"-diamine (HT4). The synthesis of terphenyldiamine HTMs is described e.g. in WO 2011/134458 A1, US 2012/223296 A1 or WO 2013/135237 A1; 1,3-phenylenediamine matrices are described e.g. in WO 2014/060526 A1. These documents are herein incorporated by reference. Many triaryl amine HTMs are commercially available.

The light emitting layer of the OLED display may comprise a plurality of sub-regions, each of the sub-regions being assigned to one of the pixels from the plurality of pixels. The light emitting layer of an individual pixel, corresponding to a sub-region of the emitting layer of the display, preferably does not touch light emitting layers of neighbor pixels. In the display manufacturing process, the organic layer comprising EMLs of individual pixels may be patterned by known methods, for example, by fine-metal masking (FMM), laser induced thermal imaging (LITI), and/or ink-jet printing (IJP) in either top emission, bottom emission or bottom emission micro cavity (see, for example, Chung et al. (2006), 70.1: Invited Paper: Large-Sized Full Color AMOLED TV: Advancements and Issues. SID Symposium Digest of Technical Papers, 37:1958-1963. doi: 10.1889/1.2451418; Lee et al. (2009), 53.4: Development of 31-Inch Full-HD AMOLED TV Using LTPS-TFT and RGB FMM. SID Symposium Digest of Technical Papers, 40: 802-804. doi: 10.1889/1.3256911). A RGB layout may be provided.

For the plurality of OLED pixels, a common electron transport layer may be formed by the electron transport layers provided in the stack of organic layers of the plurality of OLED pixels.

The common electron transport layer may comprise an organic electron transport matrix (ETM) material. Further, the common electron transport layer may comprise one or more n-dopants-. Suitable compounds for the ETM contain aromatic or heteroaromatic structural moieties, as disclosed e.g. in documents EP 1 970 371 A1 or WO 2013/079217 A1.

The cathode can be made of a metal or a metal alloy with a low work function. Transparent cathodes made of a TCO are also well-known in the art.

The stack of organic layers may be made of organic compounds having a molecular weight of less than 2000 g/mol. In an alternative embodiment, the organic compounds may have a molecular weight of less than 1000 g/mol.

DESCRIPTION OF DRAWINGS

In the following, further embodiments will be described in further detail, by way of example, with reference to figures. In the figures show.

DESCRIPTION OF EMBODIMENTS

Figure 1:
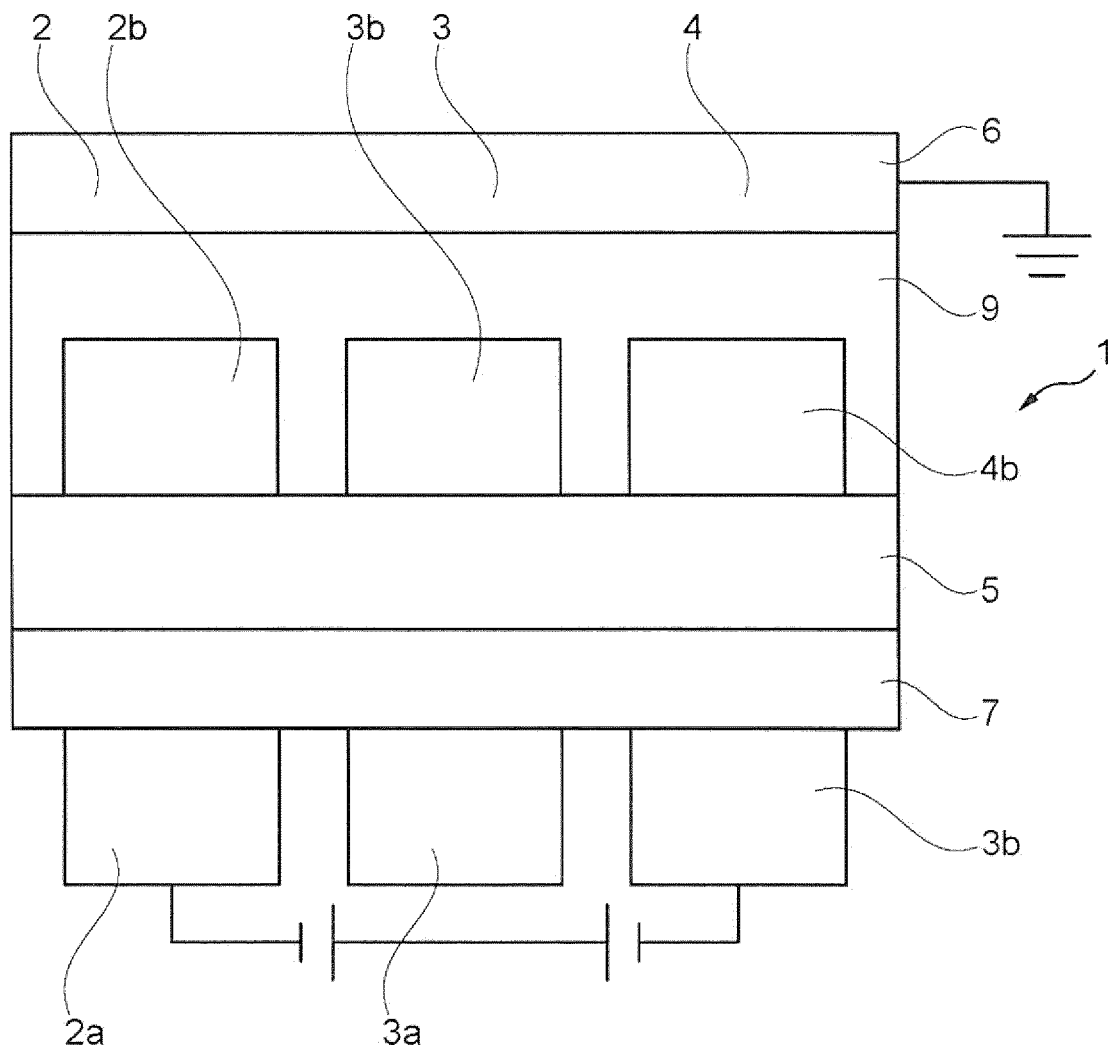
FIG. 1 a schematic representation of an active OLED display, the display having a plurality of OLED pixels.

FIG. 1 shows a schematic representation of an active OLED display 1 having a plurality of OLED pixels 2, 3, 4 provided in an OLED display 1.

In the OLED display 1, each pixel 2, 3, 4 is provided with an anode 2a, 3a, 4a being connected to a driving circuit (not shown). Various equipment able to serve as a driving circuit for an active matrix display is known in the art. In one embodiment, the anodes 2a, 3a, 4a are made of a TCO, for example of ITO.

A cathode 6 is provided on top of an organic stack comprising an electrically doped hole transport layer (HTL) 7, an electron blocking layer (EBL) 5, a light emitting layer (EML) having sub-regions 2b, 3b, 4b assigned to the pixels 2, 3, 4 and being provided separately in an electron transport layer (ETL) 9. For example, the sub-regions 2b, 3b, 4b can provide an RGB combination for a color display (R—red, G—green, B—blue). In another embodiment, pixels for individual colours may comprise analogous white OLEDs provided with appropriate combination of colour filters. By applying individual drive currents to the pixels 2, 3, 4 via the anodes 2a, 3a, 4a and the cathode 6, the display pixels 2, 3, 4 are operated independently.

Figure 2:
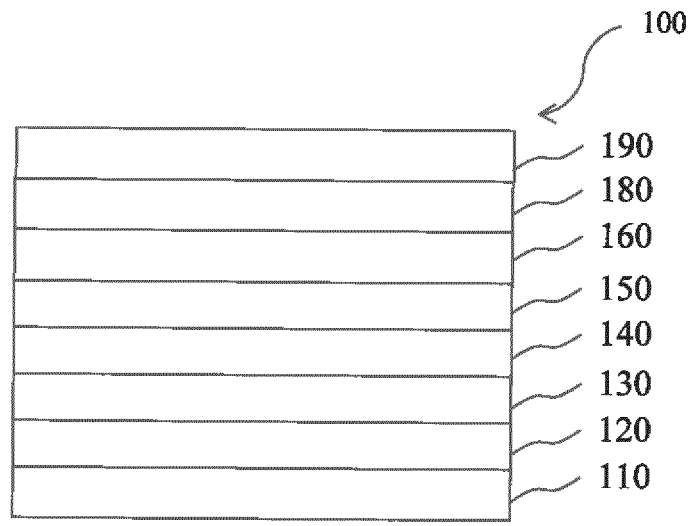
FIG. 2 is a schematic sectional view of an organic light-emitting diode (OLED), according to an exemplary embodiment of the present invention.

FIG. 2 is a schematic sectional view of an organic light-emitting diode (OLED) 100, which may represent an OLED pixel in a display device according to an exemplary embodiment of the present invention. The OLED 100 includes a substrate no, an anode 120, a hole injection layer (HIL) 130, a hole transport layer (HTL) 140, an emission layer (EML) 150, an election transport layer (En) 160. The electron transport layer (ETL) 160 is formed directly on the EML 150. Onto the electron transport layer (ETL) 160, an electron injection layer (EIL) 180 is disposed. The cathode 190 is disposed directly onto the electron injection layer (EIL) 180.

Instead of a single electron transport layer 160, optionally an electron transport layer stack (ETL) can be used.

Figure 3:
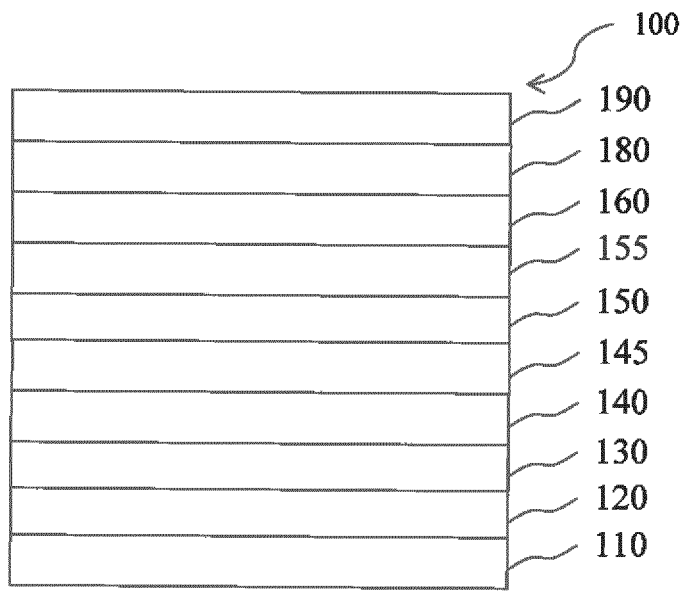
FIG. 3 is a schematic sectional view of an OLED, according to an exemplary embodiment of the present invention.

FIG. 3 is a schematic sectional view of an OLED 100, which may represent an OLED pixel in a display device according to another exemplary embodiment of the present invention. FIG. 3 differs from FIG. 2 in that the OLED 100 of FIG. 3 comprises an electron blocking layer (EBL) 145 and a hole blocking layer (HBL) 155.

Referring to FIG. 3, the OLED 100 includes a substrate no, an anode 120, a hole injection layer (HIL) 130, a hole transport layer (HTL) 140, an electron blocking layer (EBL) 145, an emission layer (EML) 150, a hole blocking layer (HBL) 155, an electron transport layer (ETL) 160, an electron injection layer (EIL) 180 and a cathode electrode 190.

Figure 4:
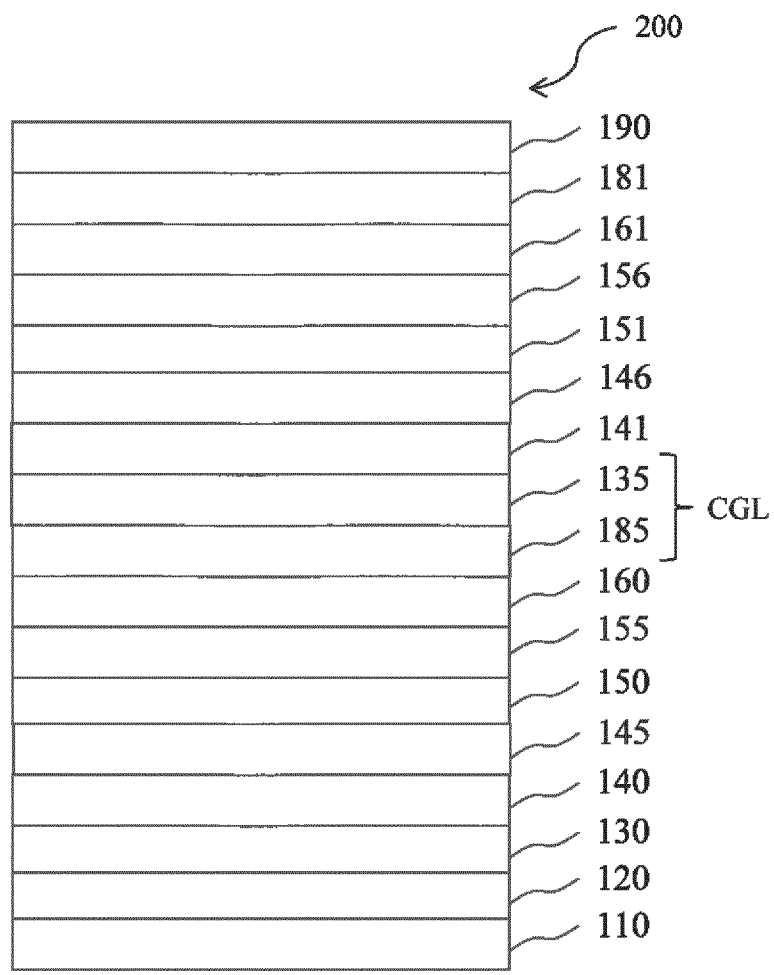
FIG. 4 is a schematic sectional view of a tandem OLED comprising a charge generation layer, according to an exemplary embodiment of the present invention.
Figure 5:
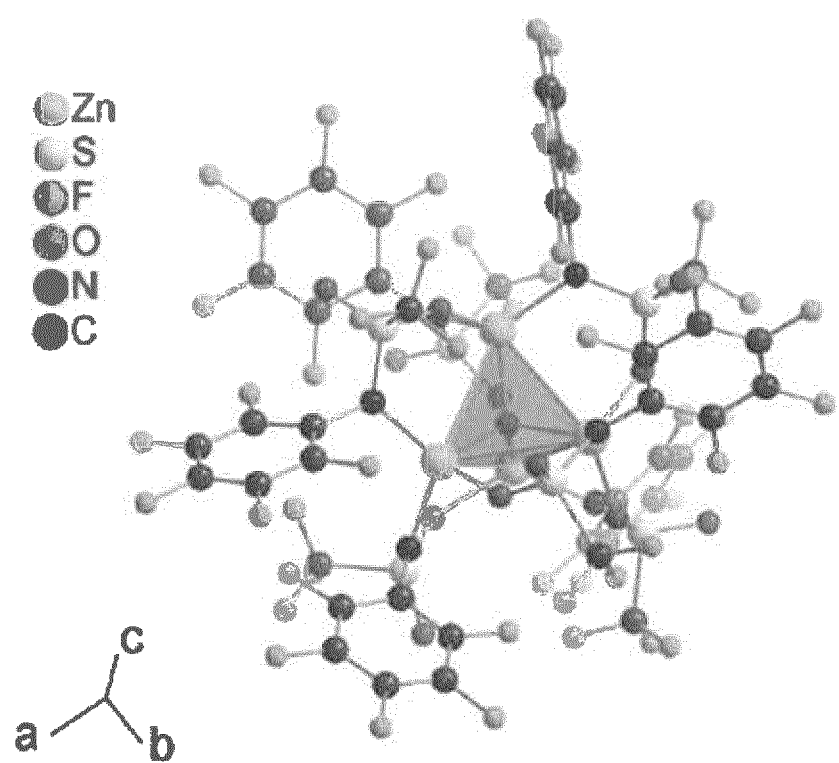
FIG. 5 shows the crystal structure of the inverse coordination complex E3, having the summary formula $C_{42}F_{48}N_6O_{13}S_6Zn_4$.

FIG. 4 is a schematic sectional view of a tandem OLED 200, which may represent an OLED pixel in a display device according to another exemplary embodiment of the present invention. FIG. 4 differs from FIG. 3 in that the OLED 100 of FIG. 3 further comprises a charge generation layer and a second emission layer.

Referring to FIG. 4, the OLED 200 includes a substrate 110, an anode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type CGL) 185, a hole generating layer (p-type charge generation layer; p-type GCL) 135, a second hole transport layer (HTL) 141, a second electron blocking layer (EBL) 146, a second emission layer (EML) 151, a second hole blocking layer (EBL) 156, a second electron transport layer (ETL) 161, a second electron injection layer (EIL) 181 and a cathode 190.

While not shown in FIG. 2, FIG. 3 and FIG. 4, a sealing layer may further be formed on the cathode electrodes 190, in order to seal the OLEDs 100 and 200. In addition, various other modifications may be applied thereto.

SYNTHESIS EXAMPLES

LiPFPI

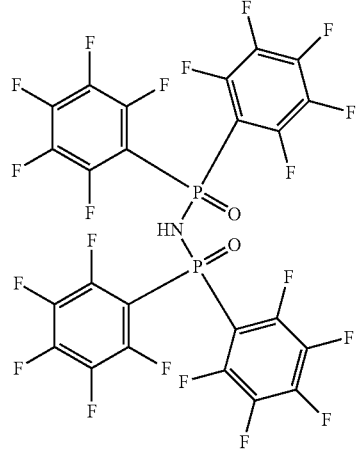

Chemical Formula: $C_{24}HF_{20}NO_2P_2$
Molecular Weight: 777.19

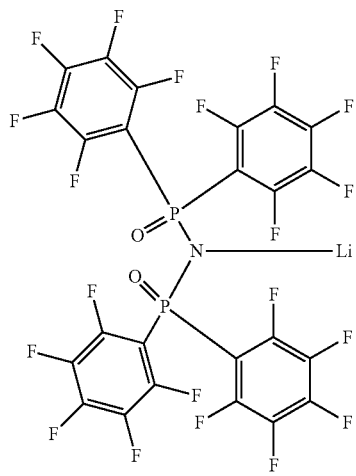

Chemical Formula: $C_{24}F_{20}LiNO_2P_2$
Molecular Weight: 783.12

1.0 g (1.29 mmol) N-(bis(perfluorophenyl)phosphoryl)-P,P-bis(perfluorophenyl)phosphinic amide is dissolved in 20 mL toluene and cooled to 0° C. 10 mg (12.9 mmol, 1.0 eq) lithium hydride are added. The mixture is heated to reflux for 2 h. After cooling to room temperature, the product is precipitated with 20 mL n-hexane, filtered off, washed with n-hexane (2×10 mL). 0.62 g (61%) product is obtained as a white solid after drying in high vacuum.

ZnPFPI

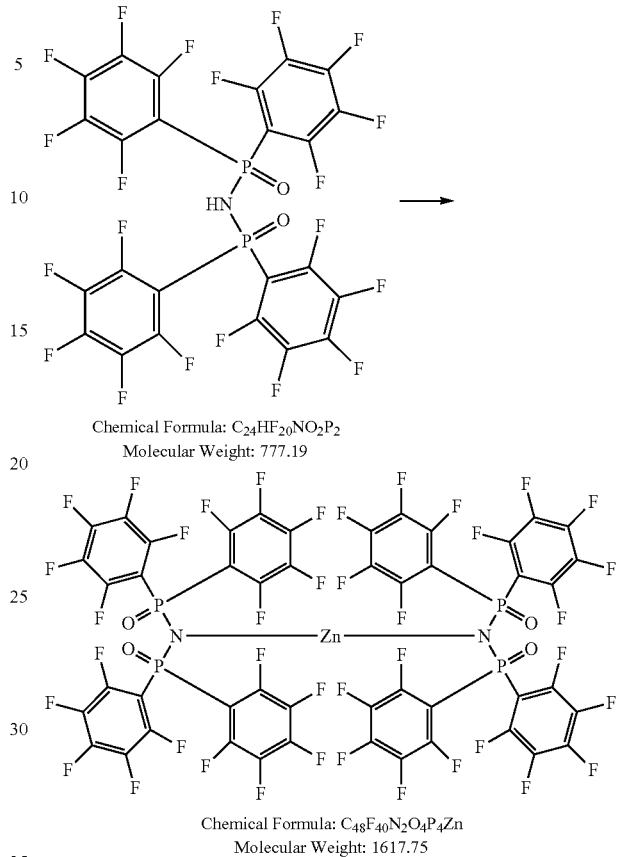

Chemical Formula: $C_{24}HF_{20}NO_2P_2$
Molecular Weight: 777.19

Chemical Formula: $C_{48}F_{40}N_2O_4P_4Zn$
Molecular Weight: 1617.75

2.0 g (2.57 mmol) N-(bis(perfluorophenyl)phosphoryl)-P,P-bis(perfluorophenyl)phosphinic side are dissolved in 50 mL dry toluene and cooled to 0° C. 1.6 mL (1.40 mmol, 0.55 eq) 0.9 M diethylzinc solution in hexane are added. The mixture is heated to reflux for 2 h. After cooling to room temperature, the product is precipitated with 50 mL n-hexane, filtered off, washed with n-hexane (2×10 mL). 1.05 g (51%) product is obtained as a white solid after drying in high vacuum.

Lithium bis((perfluorohexyl)sulfonyl)amide

Step 1: lithium bis((perfluorohexyl)sulfonyl)amide

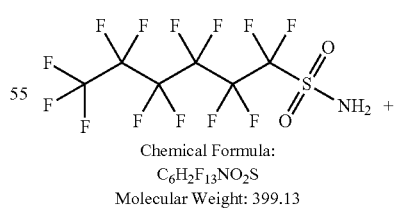

Chemical Formula: $C_6H_2F_{13}NO_2S$
Molecular Weight: 399.13

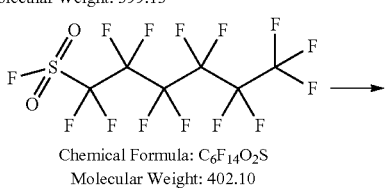

Chemical Formula: $C_6F_{14}O_2S$
Molecular Weight: 402.10

-continued

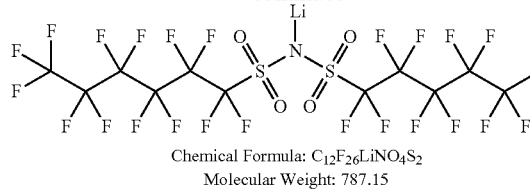

Chemical Formula: C$_{12}$F$_{26}$LiNO$_4$S$_2$
Molecular Weight: 787.15

10.25 g (25.7 mmol) perfluorohexyl sulfonyl amide is dissolved in a dried Schlenk flask in 100 mL dry THF. 0.51 g (64.2 mmol, 2.5 eq) lithium hydride is added under Ar counter-flow to the ice-cooled solution. 10.33 g (25.7 mmol, 1.0 eq) perfluorohexylsulfonylfluoride is added dropwise to the resulting slurry. The mixture is heated to 60° C. for ca 18 h. The mixture is cooled to room temperature, filtered and the solvent is removed under reduced pressure. The residue is treated with 50 mL toluene and concentrated again. The crude product is slurry-washed with 50 mL hexane, the solid is filtered-off and dried in vacuum. The 13.49 g (67%) product is obtained as a pale yellow powder.

Step 2: lithium bis((perfluorohexyl)sulfonyl)amine

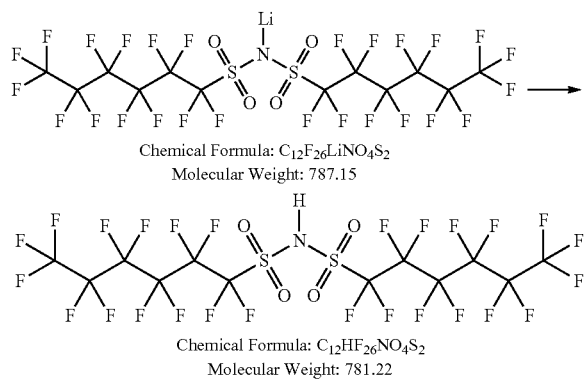

Chemical Formula: C$_{12}$F$_{26}$LiNO$_4$S$_2$
Molecular Weight: 787.15

Chemical Formula: C$_{12}$HF$_{26}$NO$_4$S$_2$
Molecular Weight: 781.22

5.0 g (6.35 mmol) bis((perfluorohexyl)sulfonyl)amide is dissolved in 100 mL diethyl ether and 40 mL 25% aqueous sulfuric acid is cautiously added under ice cooling. The mixture is stirred vigorously for 15 min. The organic phase is separated, dried over magnesium sulfate, 5 mL toluene is added to avoid foaming and the solvent is evaporated under reduced pressure. The residue is purified using a bulb-to-bulb-distillation apparatus at a temperature about 140° C. and a pressure about 4 Pa. 3.70 g (75%) product is obtained as a yellowish, waxy solid.

Step 3: lithium bis((perfluorohexyl)sulfonyl)amide

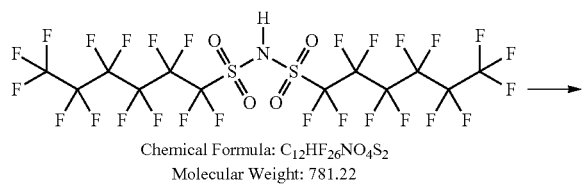

Chemical Formula: C$_{12}$HF$_{26}$NO$_4$S$_2$
Molecular Weight: 781.22

-continued

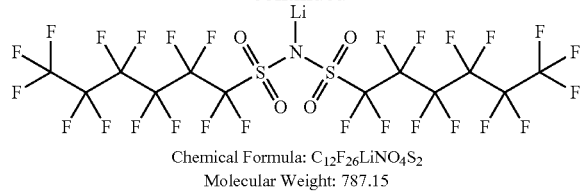

Chemical Formula: C$_{12}$F$_{26}$LiNO$_4$S$_2$
Molecular Weight: 787.15

1.0 g (1.28 mmol) bis((perfluorohexyl)sulfonyl)amine is dissolved in 5 mL methyl-tert-butylether (MTBE). 12 mg (1.24 mmol, 1.0 eq) LiH are added under Ar counter-flow. The reaction mixture is stirred overnight and the solvent subsequently removed under reduced pressure. The pale pink solid residue is dried at 60° C. in vacuum. 0.89 g (88%) product are obtained as an off-white solid.

Mass spectroscopy with electrospray ionization (MS-ESI) confirmed the expected synthesis outcome by the dominant presence of m/z 780 (anion C$_{12}$F$_{26}$NO$_4$S$_2$) in the intermediate bis((perfluorohexyl)sulfonyl)amine as well as in the Li salt.

Zinc bis((perfluorohexyl)sulfonyl)amide

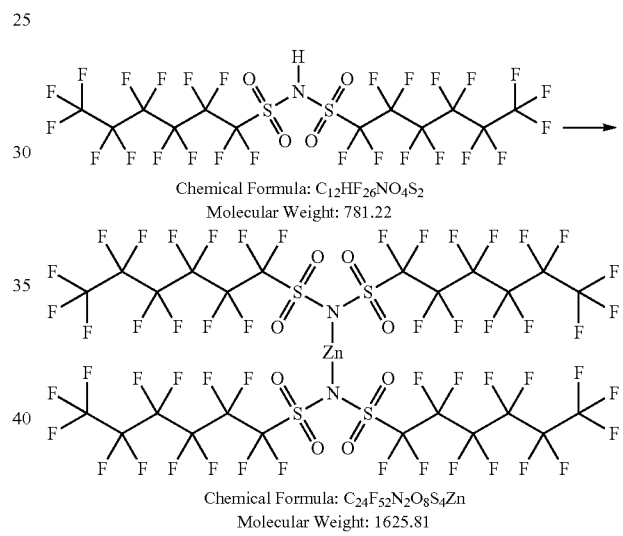

Chemical Formula: C$_{12}$HF$_{26}$NO$_4$S$_2$
Molecular Weight: 781.22

Chemical Formula: C$_{24}$F$_{52}$N$_2$O$_8$S$_4$Zn
Molecular Weight: 1625.81

1.0 g (1.28 mmol) bis((perfluorohexyl)sulfonyl)amine is dissolved in 6 mL dry MTBE. 0.71 mL (0.64 mmol, 0.5 eq) diethyl zinc solution in hexane are added dropwise. The reaction mixture is stirred overnight and the solvent removed under reduced pressure. 0.794 g (78%) pale pink solid are obtained after drying at 60° C. in vacuum.

Analogously, zinc bis(perfluoropropyl)sulfonylamide (CAS 1040352-84-8, ZnHFSI) has been prepared.

Zinc bis((perfluoropropan-2-yl)sulfonyl)amide

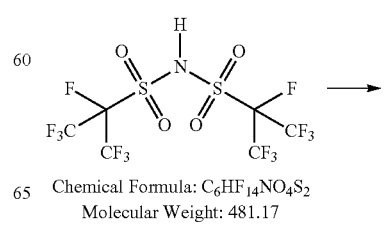

Chemical Formula: C$_6$HF$_{14}$NO$_4$S$_2$
Molecular Weight: 481.17

-continued

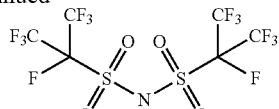

Chemical Formula: C₁₂F₂₈N₂O₈S₄Zn
Molecular Weight: 1025.71

0.5 g (1.04 mmol) bis((perfluoropropan-2-yl)sulfonyl)amide is dissolved in 10 mL dry MTBE, 0.47 mL (0.52 mmol, 0.5 eq) diethyl zinc solution in hexane are added dropwise and the mixture is stirred overnight at room temperature. 10 mL hexane are added and the resulting solid precipitate is filtered off and dried in high vacuum. 0.34 g (33%) product are obtained as a white powder.

Magnesium bis((perfluoropropan-2-yl)sulfonyl)amide

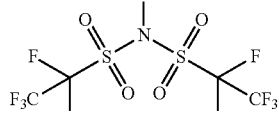

Chemical Formula: $C_6HF_{14}NO_4S_2$
Molecular Weight: 481.17

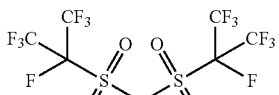

Chemical Formula: $C_{12}F_{26}MgN_2O_8S_4$
Molecular Weight: 984.64

0.5 g (1.04 mmol) bis((perfluoropropan-2-yl)sulfonyl)amine are dissolved in 10 mL dry MTBE, 0.52 mL (0.52 mmol, 0.5 eq) dibutyl magnesium solution in heptane are added dropwise and the mixture is stirred overnight at room temperature. The solvent is removed under reduced pressure and the residue is dried in high vacuum. 0.38 g (74%) product are obtained as a white powder.

Lithium tris(4,5,6,7-tetrafluoro-3-(trifluoromethyl)-1H-indazol-1-yl)hydroborate (PB-1)

Step 1: 4,5,6,7-tetrafluoro-3-(trifluoromethyl)-1H-indazole

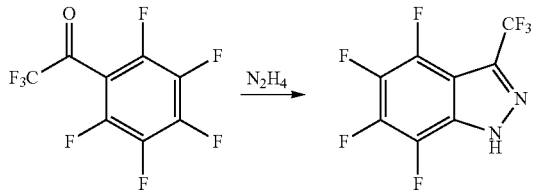

Chemical Formula: $C_8F_8O$
Molecular Weight: 264.07

Chemical Formula $C_8HF_7N_2$
Molecular Weight: 258.10

11.09 g (45.1 mmol) perfluoroacetophenone are dissolved in 100 mL toluene. The solution is cooled with an ice bath and 2.3 mL (2.37 g, 47.3 mmol, 1.05 eq) hydrazine-monohydrate is added dropwise. The mixture is heated to reflux for 3 days. After cooling to room temperature, the mixture is washed two times with too mL saturated aqueous sodium hydrogen carbonate solution and two times with 100 mL water, dried over magnesium sulfate and the solvent is removed under reduced pressure. The yellow, oily residue is distilled from bulb to bulb at a temperature about 140° C. and pressure about 12 Pa. The crude product is dissolved in hot hexane and the solution stored at −18° C. The precipitated solid is filtered off and the slurry washed two times in 10 mL hexane. 5.0 g (43%) product are obtained as a slightly yellow solid.

GCMS: confirms the expected M/z (mass/charge) ratio 258

Step 2: lithium tris(4,5,6,7-tetrafluoro-3-(trifluoromethyl)-1H-indazol-1-yl)hydroborate

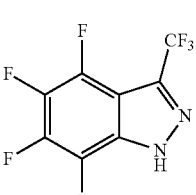

Chemical Formula: $C_8HF_7N_2$
Molecular Weight: 258.10

-continued

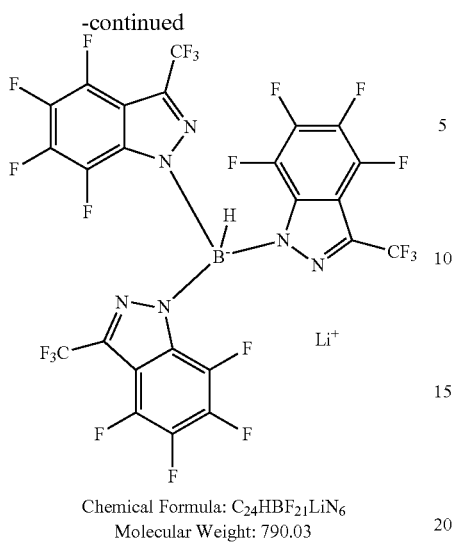

Chemical Formula: C₂₄HBF₂₁LiN₆
Molecular Weight: 790.03

5.1 g (19.8 mmol) 4,5,6,7-tetrafluoro-3-(trifluoromethyl)-1H-indazole is added under Ar counter-flow to an out-baked Schlenk flask and treated with 3 mL toluene. Freshly pulverized lithium borohydride is added to the starting material. The mixture is heated to 100° C., until hydrogen formation ceases (ca. 4 h). After slight cooling, 15 mL hexane are added, the mixture is heated to reflux for 10 min and cooled to room temperature. The precipitated solid is filtered off, washed with 10 mL hot hexane and dried in high vacuum. 2.55 g (49%) product are obtained as an off-white solid.

Lithium tris(3,5-bis(trifuloromethyl)-1H-pyrazol-1-yl)hydroborate (PB-2)

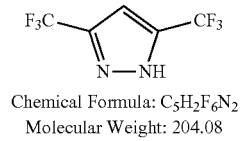

Chemical Formula: C₅H₂F₆N₂
Molecular Weight: 204.08

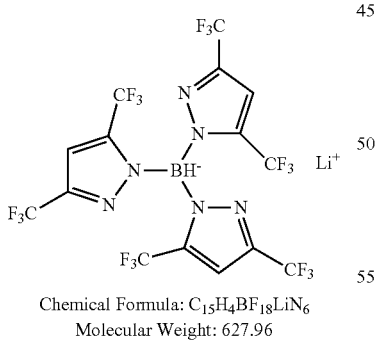

Chemical Formula: C₁₅H₄BF₁₈LiN₆
Molecular Weight: 627.96

2.0 g (9.8 mmol, 5 eq) 3,5-bis(trifluoromethyl)pyrazole in a baked-out Schlenk flask is dissolved in 5 mL dry toluene. 43 mg (1.96 mmol, 1 eq) freshly pulverized lithium borohydride is added under Ar counter-flow and the mixture is heated to reflux for 3 days. The solvent and the excessive starting material are removed by distillation under reduced pressure and the residue is crystallized from n-chlorohexane. 0.25 g (20%) product is obtained as a white solid.

Lithium tris(4,5,6,7-tetrafluoro-3-(perfluorophenyl)-1H-indazol-1-yl)hydroborate (PB-3)

Step 1: 4,5,6,7-tetrafluoro-3-(perfluorophenyl)-1H-indazole

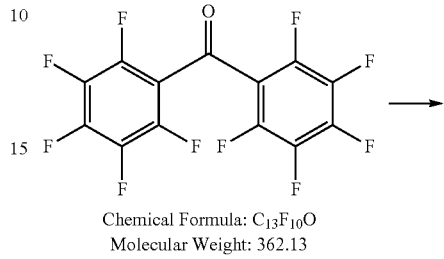

Chemical Formula: C₁₃F₁₀O
Molecular Weight: 362.13

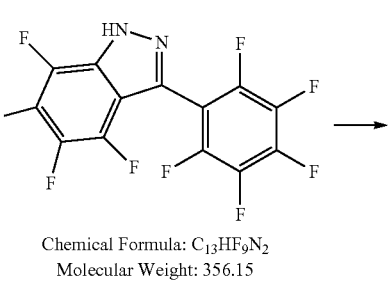

Chemical Formula: C₁₃HF₉N₂
Molecular Weight: 356.15

20.0 g (54.8 mmol) perfluorobenzophenone are dissolved in 200 mL toluene. 4.0 mL (4.11 g, 82.1 mmol, ca. 1.5 eq) hydrazine-monohydrate is added dropwise to the ice-cooled solution. 40 g sodium sulfate are added and the mixture is heated to reflux for 2 days. After cooling, 10 mL acetone are added to the reaction mixture and the resulting slurry is stirred for 1 h at room temperature. The solid is filtered off, thoroughly washed with 4×50 mL toluene, organic fractions are combined and washed two times with saturated aqueous sodium hydrogen carbonate. The solvent is removed under reduced pressure and the residue purified by column chromatography. 7.92 g (41%) product are obtained as a pale yellow solid.

GC-MS: confirms the expected M/z (mass/charge) ratio 356

Step 2: lithium tris(4,5,6,7-tetrafluoro-3-(perfluorophenyl)-1H-indazol-1-yl)hydroborate Chemical Formula: C₁₃HF₉N₂
Molecular Weight: 356.15

-continued

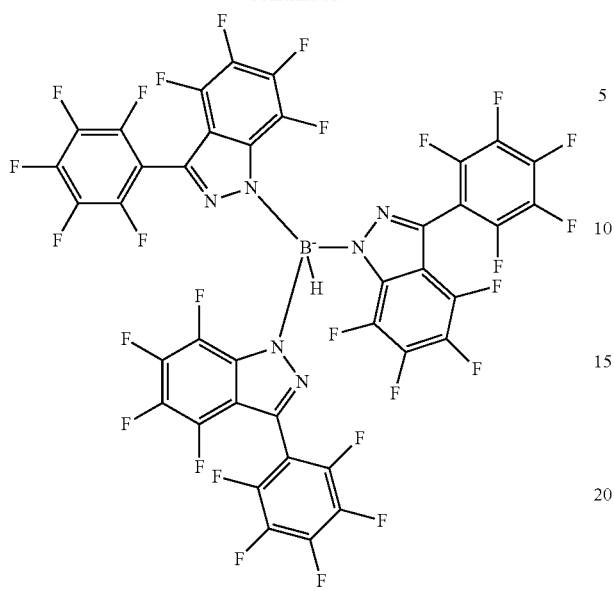

Chemical Formula: C$_{39}$HBF$_{27}$LiN$_6$
Molecular Weight: 1084.19

1.02 g (2.86 mmol, 3.0 eq) 4,5,6,7-tetrafluoro-3-(perfluorophenyl)-1H-indazole are dissolved in 5 mL chlorobenzene in a baked-out Schlenk flask. Freshly pulverized lithium borohydride (21 mg, 0.95 mmol, 1.0 eq) is added under Ar counter-flow. The mixture is heated to 150° C. for 2 days and cooled to room temperature. The solvent is removed under reduced pressure and the residue dried in high vacuum. The crude is further purified by drying in a bulb to bulb apparatus at a temperature about 150° C. and a pressure about 12 Pa. 0.57 g (70%) product are obtained as an off-white solid.

Lithium tris(3-cyano-5,6-difluoro-1H-indazol-1-yl)hydroborate (PB-4)

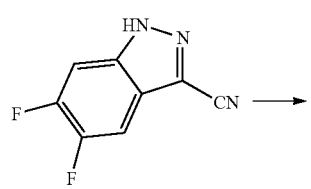

Chemical Formula: C$_{13}$HF$_9$N$_2$
Molecular Weight: 356.15

-continued

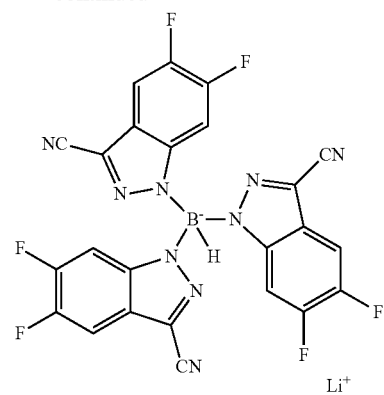

Chemical Formula: C$_{24}$H$_7$BF$_6$LiN$_9$
Molecular Weight: 553.12

Freshly pulverized lithium borohydride (15 mg, 0.7 mmol, 1.0 eq) is placed in a baked-out pressure tube, 0.5 g (2.79 mmol, 4.0 eq) 5,6-difluoro-1H-indazole-3-carbonitrile are added under Ar counter-flow and washed down with 1 mL toluene. The pressure tube is closed and heated to a temperature about 160° C. for ca 21 h. After cooling to room temperature, the mixture is treated with 5 mL hexane in an ultra-sonic bath for ca 30 min. The precipitated solid is filtered off and washed with hexane (20 mL in total). After drying, 0.48 g yellowish solid are obtained.

Zinc(II) tris(3,5-bis(trifluoromethyl)-1H-pyrazol-1-yl)hydroborate (PB-5)

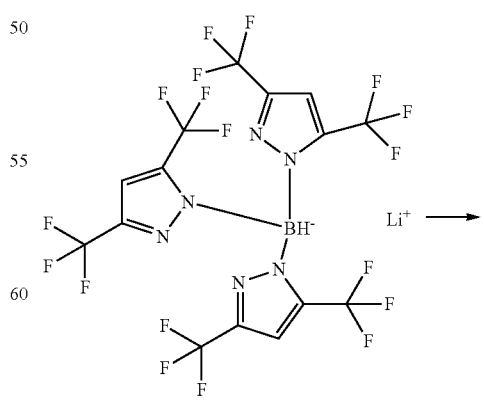

Chemical Formula: C$_{15}$H$_4$BF$_{18}$LiN$_6$
Molecular Weight: 627.96

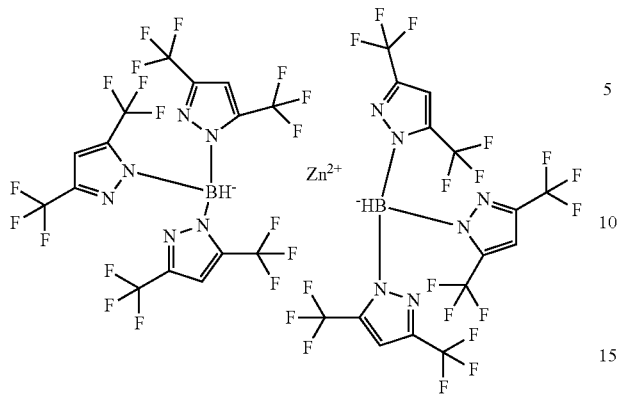

Chemical Formula: $C_{30}H_8B_2F_{36}N_{12}Zn$
Molecular Weight: 1307.42

0.57 g (0.91 mmol) lithium tris(3,5-bis(trifluoromethyl)-1H-pyrazol-1-yl)hydroborate are dissolved in 6 mL N,N-dimethyl formamide. An aqueous solution of 62 mg zinc dichloride in 1 mL water is added dropwise. 20 mL water are fu er added and the mixture is treated in an ultra-sonic bath for 2 h. The precipitate is filtered off and dried in high vacuum. 0.485 g (82%) product are obtained as a white solid.

Exemplary Compound E3

A precursor compound E2 has been prepared according to Scheme 1

Scheme 1: Synthesis of bis((1,1,1-trifluoro-N-(perfluorophenyl)methyl)-sulfonamido)zinc

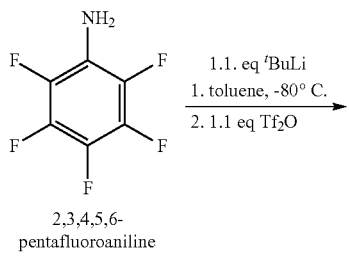

2,3,4,5,6-pentafluoroaniline

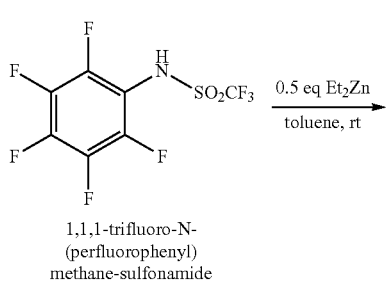

1,1,1-trifluoro-N-(perfluorophenyl)methane-sulfonamide

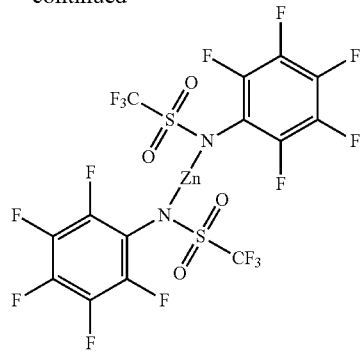

bis((1,1,1-trifluoro-N-(perfluorophenyl)methyl)-sulfonamido)zinc

Step 1: Synthesis of 1,1,1-trifluoro-N-(perfluorophenyl)methanesulfonamide

A 250 mL Schlenk flask is heated in vacuum and, after cooling, purged with nitrogen. Perfluoroaniline is dissolved in 100 mL toluene and the solution cooled to −80° C. A 1.7 M t-butyl lithium solution in hexane is added dropwise via syringe over 10 min. The reaction solution changes from clear to cloudy and is stirred for 1 h at −80° C. After that, the solution is allowed to warm to −60° C. and 1.1 eq of trifluoromethanesulfonic anhydride is added dropwise to the solution. Then, the cooling bath is removed and the reaction mixture is allowed to slowly to ambient temperature and stirred overnight, whereby the color changes to light orange. Additionally, a white solid forms. The precipitated by-product lithium trifluoro-methane sulfonate is filtered off by suction filtration over a sintered glass filter and washed with 2×30 mL toluene and 30 mL n-hexane. The orange filtrate is evaporated and dried in high vacuum, forming crystals. The crude product is then purified by bulb-to-bulb distillation (135° C.@$1.2\times10^{-1}$ mbar), resulting in a crystalline colorless solid (main fraction).

$^1$H NMR [$d^6$-DMSO, ppm] δ: 13.09 (s, 1H, N-H).
$^{13}$C{$^1$H} NMR [$d^6$-DMSO, ppm] δ: 116.75 (m, $C_i$-$C_6F_5$), 120.74 (q, $^1J_{CF}$=325 Hz, $CF_3$), 136.39, 138.35 (2m, $^2J_{CF}$=247 Hz, m-$C_6F_5$), 137.08, 139.06 (2m, $^2J_{CF}$=247 Hz, p-$C_6F_5$), 142.98, 144.93 (2m, $^2J_{CF}$=247, Hz o-$C_6F_5$).
$^{19}$F NMR [$d^6$-DMSO, ppm] δ: −77.45 (m, $CF_3$), −148.12 (m, $C_6F_5$), −160.79 (m, p-$C_6F_5$), −164.51 (m, $C_6F_5$).
ESI-MS: m/z-neg=314 (M-H).
EI-MS: m/z=315 (M), 182 (M-$SO_2CF_3$), 69 ($CF_3$).

Step 2: Synthesis of bis((1,1,1-trifluoro-N-(perfluorophenyl)methyl)-sulfonamido)zinc A 100 mL Schlenk flask is heated in vacuum and, after cooling, purged with nitrogen. 1,1,1-trifluoro-N-(perfluorophenyl) methane sulfonamide is dissolved in 10 mL toluene and 0.5 eq of diethyl zinc in hexane is added dropwise to the solution via syringe at ambient temperature. During the addition, a fog forms in the flask and the reaction solution becomes jelly and cloudy. The solution is stirred for further 30 min at this temperature. After that, 30 mL n-hexane are added and a white precipitate forms, which is subsequently filtered over a sintered glass filter (pore 4) under inert atmosphere. The filter cake is twice washed with 15 mL n-hexane and dried in high vacuum at 100° C. for 2 h.

Yield: 660 mg (0.95 mmol, 60% based on 1,1,1-trifluoro-N-perfluorophenyl) methane sulfonamide) as a white solid.

$^{13}C\{^1H\}$ NMR [$d^6$-DMSO, ppm] δ: 121.68 (q, $^1J_{CF}$=328 Hz, $CF_3$), 123.56 (m, $C_i$-$C_6F_5$), 133.98, 135.91 (2m, $^2J_{CF}$=243 Hz, p-$C_6F_5$), 136.15, 138.13 (2m, $^2J_{CF}$=249 Hz, m-$C_6F_5$), 142.33, 144.24 (2m, $^2J_{CF}$=240, Hz o-$C_6F_5$).

ESI-MS: m/z-neg=314 (M-Zn-L).

EI-MS: m/z=692 (M), 559 (M-$SO_2CF_3$) 315 ($C_6F_5NHSO_2CF_3$), 182 ($C_6F_5NH$), 69 ($CF_3$).

Exemplary Compound E3

9.1 g E2 is sublimed at the temperature 240° C. and pressure $10^{-3}$ Pa.

yield 5.9 g (65%).

The sublimed material forms colorless crystals. One crystal of an appropriate shape and size (0.094×0.052×0.043 $mm^3$) has been closed under Ar atmosphere in a glass capillary and analyzed on Kappa Apex II diffractometer (Bruker-AXS, Karlsruhe, Germany) with mono-chromatic X-ray radiation from a source provided with molybdenum cathode (λ=71.073 pm). Overall 37362 reflexions were collected within the theta range 1.881 to 28.306°.

The structure was resolved by direct method (SHELXS-97, Sheldrick, 2008) and refined with a full-matrix least-squares method (SHELXL-2014/7, Olex2 (Dolomanov, 2017).

TABLE 1

| Compound | Structure |
|---|---|
| F1 (CAS 1242056-42-3) | 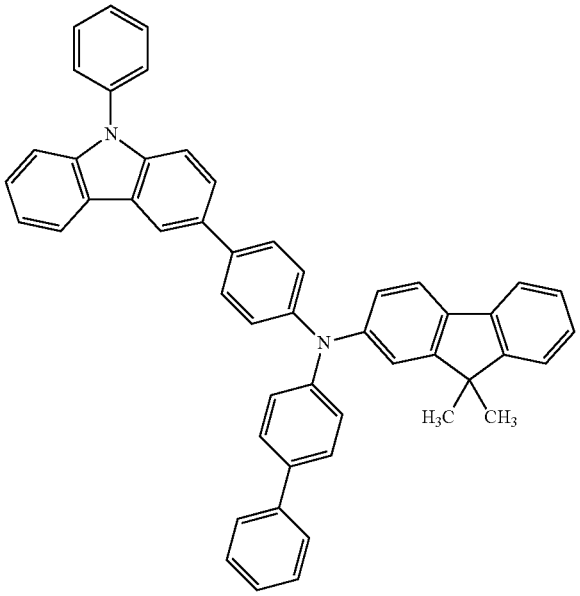 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] |
| F2 (CAS 1440545-225-1) | 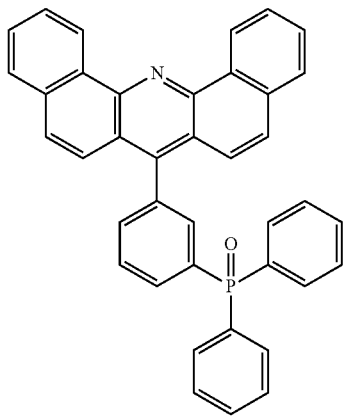 [SMILES: O=P(c1ccccc1)(c1ccccc1)c1cccc(-c2c3ccc4ccccc4c3nc3c2ccc2ccccc23)c1] |

TABLE 1-continued auxiliary materials for device examples

| Compound | Structure |
|---|---|
| F3 (CAS 597578-38-6) | |
| F4 (CAS 1207671-22-4) | |
| F5 CAS 1638271-85-8 | |
| F6 CAS 721969-94-4 | |

TABLE 1-continued auxiliary materials for device examples

| Compound | Structure |
|---|---|
| PD2<br>2,2',2''-(cyclopropane-1,2,3-triylidene)-tris[2-(4-cyanoperfluorophenyl)-acetonitrile]<br>(CAS1224447-88-4) | 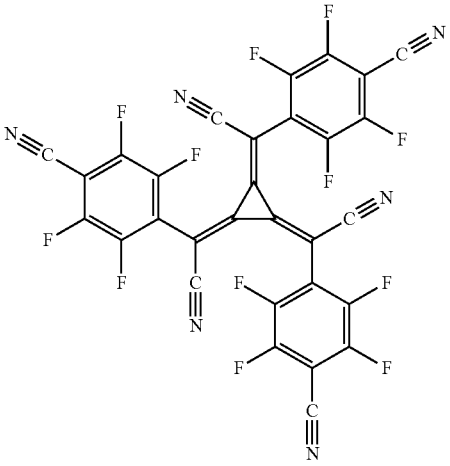 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F] |
| LiQ<br>8-Hydroxyquinolato lithium<br>(CAS 850918-68-2) | 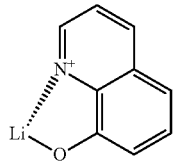 |
| CN-HAT<br>(CAS 105598-27-4) | 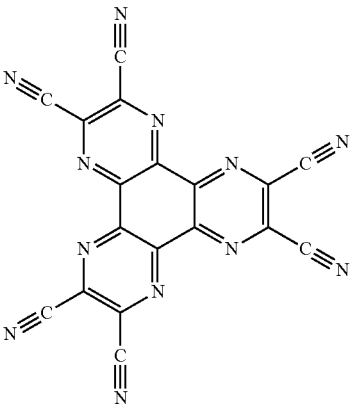 [SMILES: N#Cc1nc2c3nc(C#N)c(C#N)nc3c3nc(C#N)c(C#N)nc3c2nc1C#N] |

ABH-113 is an emitter host and NUBD-370 and DB-20 are blue fluorescent emitter dopants, all commercially available from SFC, Korea.

Before use in vacuum deposition processes, the auxiliary materials as well as the tested compounds, including commercially available sulfonyl imide salts, like MgTFSI (Alfa Aesar, CAS 133385-16-1), MnTFSI (Alfa Aesar, CAS 207861-55-0), ScTFSI (Alfa Aesar, CAS 176726-07-1), Fe(III)(TFSI) (Alfa Aesar, CAS 207861-59-4), LiNFSI (American Custom Chemicals Corporation, CAS 119229-99-1), were purified by preparative vacuum sublimation.

DEVICE EXAMPLES

Example 1

Bottom Emitting White OLED Pixel, Comprising a Metal Complex or Metal Salt as a p-dopant Concentrated in a Neat Hole Generating Sub-Layer On a glass substrate provided with an ITO anode having thickness 90 nm, there were subsequently deposited 10 nm hole injection layer made of F1 doped with 8 wt % PD-2; 140 nm thick undoped hole transport layer made of neat F1;

20 nm thick first emitting layer formed of ABH113 doped with 3 wt % BD200 (both supplied by SFC, Korea); 25 thick first electron transport layer made of neat F2; 10 nm thick electron-generating part of the charge-generating layer (n-CGL) made of F3 doped with 5 wt % Yb; 2 nm thick interlayer made of F4; 30 nm thick hole-generating part of the charge-generating layer (p-CGL) made of PB-1; 10 nm thick second hole transport layer made of neat F1; 20 nm second emitting layer of the same thickness and composition as the first emitting layer; 25 nm thick first electron transport layer made of neat F2; 10 nm thick electron injection layer (EIL) made of F3 doped with 5 wt % Yb; 100 nm Al cathode.

All layers were deposited by vacuum thermal evaporation (VTE).

At the current density 10 mA/cm$^2$, the operational voltage of the device 8 V was well comparable with the same device comprising a commercial state-of-art p-dopant instead of PB-1. Exact calibration of measuring equipment necessary for luminance/efficiency comparison was not made in this experiment.

Example 2

Bottom Emitting Blue OLED Pixel Comprising a Metal Complex or Metal Salt as a p-dopant Concentrated in a Neat Hole Injecting Sub-Layer On the same glass substrate provided with an ITO anode as in the Example 1, following layers were subsequently deposited by VTE: 10 nm hole injection layer made of the compound PB-1; 120 nm thick HTL made of neat F1; 20 nm EML made of ABH113 doped with 3 wt % NUBD370 (both supplied by SFC, Korea), 36 nm EIL/ETL made of F2 doped with 50 wt % LIQ; 100 nm Al cathode.

Comparative device comprised the HIL made of the compound CN-HAT (CAS 105598-27-4) instead of PB-1.

The inventive device achieved current density 15 mA/cm$^2$ and external quantum efficiency (EQE) 5.4% at an operational voltage 5.2 V, whereas the comparative device exhibited the same current density at a significantly higher voltage 5.4 V and with a significantly lower EQE 4.9%.

Example 3

Bottom Emitting Blue OLED Pixel Comprising a Hole Injection Sub-Layer Consisting of a Hole Transport Matrix Homogeneously Doped with a Metal Complex or Metal Salt On the same glass substrate provided with an ITO anode as in the Example 2, following layers were subsequently deposited by VTE: 10 nm hole injection layer made of the matrix compound F2 doped with 8 weight % PB-1; 120 nm thick HTL made of neat F1; 20 nm EML made of ABH113 doped with 3 wt % NUBD370 (both supplied by SFC, Korea), 36 nm EIL/ETL made of F2 doped with 50 wt % LiQ; 100 nm Al cathode.

The inventive device achieved current density 15 mA/cm$^2$ and EQE 5.6% at a voltage 5.6 V, LT97 (operational time necessary for luminance decrease to 97% of its initial value at the current density 15 mA/cm2) was 135 hours.

Example 4

White Display Pixel Comprising a Hole Generating Sub-Layer Consisting of a Hole Transport Matrix Homogeneously Doped with a Metal Complex or a Metal Salt In the device prepared analogously as in Example 1, the neat PB-1 layer was replaced with a layer of the same thickness, consisting of F2 doped with 35 weight % PB-1.

Example 5

Blue Display Pixel Comprising a Metal Complex or a Metal Salt as a p-dopant Concentrated in a Neat Hole Injection Sub-Layer Table 2a schematically describes the model device TABLE 2a

| Material | c [wt %] | d [nm] |
|---|---|---|
| ITO | 100 | 90 |
| p-dopant | 100 | 3* |
| F1 | 100 | 120 |
| ABH113: NUBD370 | 97:3 | 20 |
| F2: LiQ | 50:50 | 36 |
| Al | 100 | 100 |

*E3 has been tested as a layer only 1 nm thin.

The results for two exemplary p-dopants are given in Table 2b

TABLE 2b

| * j = 15 mA/cm$^2$ <br> **j = 30 mA/cm$^2$ | U* [V] | EQE* [%] | CIE-y* | U(50 h)-U(1 h)** [V] |
|---|---|---|---|---|
| 3 nm LiTFSI | 5.28 | 6.6 | 0.090 | 0.275 |
| 3 nm MgTFSI | 5.05 | 5.4 | 0.094 | 0.041 |
| 3 nm ZnHFSI | 5.13 | 5.2 | 0.095 | 0.143 |
| 3 nm MnTFSI | 5.05 | 5.1 | 0.096 | 0.139 |
| 3 nm LiNFSI | 5.08 | 5.4 | 0.096 | 0.049 |
| 3 nm Sc(TFSI) | 5.03 | 5.1 | 0.096 | 0.128 |
| 3 nm E3 | 5.38 | 5.7 | 0.094 | 0.246 |
| 1 nm E3 | 5.11 | 5.4 | 0.096 | 0.040 |

Example 6

Blue Display Pixel Comprising a Hole Injection Sub-Layer Consisting of a Hole Transport Matrix Homogeneously Doped with a Metal Complex or a Metal Salt Table 3a schematically describes the model device.

TABLE 3a

| Material | c [wt %] | d [nm] |
|---|---|---|
| ITO | 100 | 90 |
| F1: p-dopant | 92:8 (mol % #) | 10 |
| F1 | 100 | 120 |
| ABH113: NUBD370 | 3 | 20 |

TABLE 3a-continued

| Material | c [wt %] | d [nm] |
|---|---|---|
| F2: LiQ | 50 | 36 |
| Al | 100 | 100 | based on molar amount of metal atoms

The results for two exemplary p-dopants are given in Table 3b

TABLE 3b

| *j = 15 mA/cm$^2$<br>**j = 30 mA/cm$^2$ | U* [V] | EQE* [%] | CIE-y* | U(50 h)-U(1 h)** [V] |
|---|---|---|---|---|
| LiTFSI | 8.06 | 7.1 | 0.095 | 0.639 |
| MgTFSI | 5.07 | 5.6 | 0.093 | 0.001 |
| ZnHFSI | 5.08 | 5.4 | 0.094 | 0.135 |
| MnTFSI | 5.05 | 5.4 | 0.095 | 0.023 |
| LiNFSI | 5.81 | 5.6 | 0.095 | -0.092 |
| Fe(III)(TFSI) | 5.16 | 5.7 | 0.094 | 0.006 |
| Sc(TFSI) | 5.41 | 5.5 | 0.094 | 0.144 |
| E3 | 5.15 | 5.7 | 0.094 | -0.015 |

Example 7

Blue Display Pixel Comprising a Metal Complex or a Metal Salt as a p-dopant Concentrated in a Neat Hole Generation Sub-Layer Table 4a schematically describes the model device.

TABLE 4a

| Material | c [wt %] | d [nm] |
|---|---|---|
| ITO | 100 | 90 |
| F1: PD-2 | 192:8 | 10 |
| F1 | 100 | 145 |
| ABH113: BD200 | 97:3 | 20 |
| F5 | 100 | 25 |
| F6: Li | 99:1 | 10 |
| ZnPc | 100 | 2 |
| p-dopant | 100 | 1 |
| F1 | 100 | 30 |
| ABH113: BD200 | 97:3 | 20 |
| F5 | 100 | 26 |
| F6: Li | 99:1 | 10 |
| Al | 100 | 100 |

The results for two exemplary p-dopants are given in Table 4b

TABLE 4b

| *j = 10 mA/cm$^2$<br>** j = 30 mA/cm$^2$ | U* [V] | EQE* [%] | CIE-y* |
|---|---|---|---|
| LiTFSI | 10.65 | 6.3 | 0.066 |
| ZnHFSI | 7.77 | 12.9 | 0.085 |
| MnTFSI | 8.03 | 14.1 | 0.083 |
| LiNFSI | 8.03 | 12.0 | 0.081 |
| E3 | 7.52 | 13.5 | 0.083 |

Example 8

Blue Display Pixel Comprising a Hole Generation Sub-Layer Consisting of a Hole Transport Matrix Homogeneously Doped with a Metal Complex or a Metal Salt Table 5a schematically describes the model device.

TABLE 5a

| Material | c [wt %] | d [nm] |
|---|---|---|
| ITO | 100 | 90 |
| F1: PD-2 | 92:8 | 10 |
| F1 | 100 | 145 |
| ABH113: BD200 | 97:3 | 20 |
| F5 | 100 | 25 |
| F6: Li | 99:1 | 10 |
| ZnPc | 100 | 2 |
| F1: p-dopant | 84:16<br>(mol %) # | 10 |
| F1 | 100 | 30 |
| ABH113: BD200 | 97:3 | 20 |
| F5 | 100 | 26 |
| F6: Li | 99:1 | 10 |
| Al | 100 | 100 |

* based on molar amount of metal atoms

The results for two exemplary p-dopants are given in Table 5b

TABLE 5b

| *j =10 mA/cm$^2$<br>**j =10 mA/cm$^2$ | U* [V] | EQE* [%] | CIE-y* | U(50 h)-U(1 h) ** [V] |
|---|---|---|---|---|
| LiTFSI | 8.98 | 13.4 | 0.082 | |
| ZnHFSI | 8.25 | 14.1 | 0.085 | -0.072 |
| MnTFSI | 8.39 | 15.1 | 0.088 | 0.277 |
| LiNFSI | 8.02 | 14.0 | 0.086 | -0.154 |
| E3 | 7.75 | 14.2 | 0.087 | 0.094 |

The features disclosed in the foregoing description and in the dependent claims may, both separately and in any combination thereof, be material for realizing the aspects of the disclosure made in the independent claims, in diverse forms thereof.

Key symbols and abbreviations used throughout the application:
CV cyclic voltammetry
DSC differential scanning calorimentry
EBL electron blocking layer
EIL electron injecting layer
EML emitting layer
eq. equivalent
ETL electron transport layer
ETM electron transport matrix
Fc ferrocene
Fc$^+$ ferricenium
HBL hole blocking layer
HIL hole injecting layer
HOMO highest occupied molecular orbital
HPLC high performance liquid chromatography
HTL hole transport layer
p-H p-doped hole transport layer
HTM hole transport matrix
ITO indium tin oxide
LUMO lowest unoccupied molecular orbital
mol % molar percent NMR nuclear magnetic resonance
OLED organic light emitting diode
OPV organic photovoltaics
QE quantum efficiency
$R_f$ retardation factor in TLC
RGB red-green-blue
TCO transparent conductive oxide
TFT thin film transistor
$T_g$ glass transition temperature
TLC thin layer chromatography
wt % weight percent

The invention claimed is:

1. Display device comprising
a plurality of OLED pixels comprising at least two OLED pixels, the OLED pixels comprising an anode, a cathode, and a stack of organic layers, wherein the stack of organic layers
is arranged between and in contact with the cathode and the anode, and
comprises a first electron transport layer, a first hole transport layer, and a first light emitting layer provided between the first hole transport layer and the first electron transport layer, and
a driving circuit configured to separately driving the pixels of the plurality of OLED pixels,
wherein, for the plurality of OLED pixels, the first hole transport layer is provided in the stack of organic layers as a common hole transport layer shared by the plurality of OLED pixels, and the first hole transport layer comprises
(i) at least one first hole transport matrix compound consisting of covalently bound atoms and
(ii) at least one electrical p-dopant selected from metal salts and from electrically neutral metal complexes comprising a metal cation and at least one anion and/or at least one anionic ligand consisting of at least 4 covalently bound atoms, wherein an acidity of an electrically neutral conjugated acid formed from the at least one anion and/or the at least one anionic ligand by addition of one or more protons in 1,2-dichloroethane is higher than that of HCl,
wherein the metal cation of the electrical p-dopant is selected from alkali metals;
alkaline earth metals, Pb, Mn, Fe, Co, Ni, Zn, Cd; rare earth metals in oxidation state (II) or (III); Al, Ga, In; and from Sn, Ti, Zr, Hf, V, Nb, Ta, Cr, Mo and W in oxidation state (IV) or less.

2. Display device according to claim 1, wherein the anion and/or the anionic ligand consists of at least 5 covalently bound atoms.

3. Display device according to claim 1, wherein the anion and/or anionic ligand comprises at least one atom selected from B, C, N.

4. Display device according to claim 1, wherein the anion and/or anionic ligand comprises at least two atoms selected from B, C and N which are bound to each other by a covalent bond.

5. Display device according to claim 1, wherein the anion and/or anionic ligand comprises at least one peripheral atom selected from H, N, O, F, Cl, Br and I.

6. Display device according to claim 1, wherein the anion and/or anionic ligand comprises at least one electron withdrawing group selected from halogenated alkyl, halogenated (hetero)aryl, halogenated (hetero)arylalkyl, halogenated alkylsulfonyl, halogenated (hetero)arylsulfonyl, halogenated (hetero)arylalkylsulfonyl, cyano.

7. Display device according to claim 6, wherein the electron withdrawing group is a perhalogenated group.

8. Display device according to claim 7, wherein the perhalogenated electron withdrawing group is a perfluorinated group.

9. Display device according to claim 1, wherein the metal cation of the p-dopant is selected from Li(I), Na(I), K(I), Rb(I), Cs(I); Mg(II), Ca(II), Sr(II), Ba(II), Sn(II), Pb(II), Mn(II), Fe(II), Co(II), Ni(II), Zn(II), Cd(II), Al(III); rare earth metal in oxidation state (III), V(III), Nb(III), Ta(III), Cr(III), Mo(III), W(III) Ga(III), In(III) and from Ti(IV), Zr(IV), Hf(IV), Sn(IV).

10. Display device according to claim 1, wherein in the p-dopant molecule, the atom of the anion and/or of the anionic ligand which is closest to the metal cation is a C or a N atom.

11. Display device according to claim 1, wherein the electrical p-dopant has energy level of its lowest unoccupied molecular orbital computed by standard quantum chemical method and expressed in absolute vacuum scale at least 0.5 eV above the energy level of the highest occupied orbital of the first hole transport matrix compound computed by the standard quantum chemical method, wherein the standard quantum chemical method uses the software package TURBOMOLE using DFT functional B3LYP with the basis set def2-TZVP.

12. Display device according to claim 1, wherein the first hole transport matrix compound is an organic compound.

13. Method for preparing the display device according to claim 1, the method comprising at least one step wherein the first hole transport matrix compound and the electrical p-dopant are in mutual contact exposed to a temperature above 50° C.

14. Method according to claim 13, wherein
(i) the p-dopant and the first hole transport matrix compound are dispersed in a solvent,
(ii) the dispersion is deposited on a solid support and
(iii) the solvent is evaporated at an elevated temperature.

15. Method according to claim 13, further comprising at least one step wherein the p-dopant is evaporated at a reduced pressure.

16. Method according to claim 13, wherein the p-dopant is used in form of a solid hydrate.

17. Method according to claim 15, wherein the p-dopant is used as an anhydrous solid comprising less than 0.10 wt % water.

* * * * *